(12) United States Patent
Polu et al.

(10) Patent No.: US 9,653,948 B2
(45) Date of Patent: May 16, 2017

(54) WIRELESS RESONANT ELECTRIC FIELD POWER TRANSFER SYSTEM AND METHOD USING HIGH Q-FACTOR COILS

(75) Inventors: Nagesh Polu, St. John's (CA); Md. Jahangir Alam, Grande Prairie (CA); Sheikh Mominul Islam, St. John's (CA); Nima Soltani, North York (CA)

(73) Assignee: SOLACE POWER INC., Mount Pearl, NL (CA)

( * ) Notice: Subject to any disclaimer, the term of this patent is extended or adjusted under 35 U.S.C. 154(b) by 210 days.

(21) Appl. No.: 13/607,474

(22) Filed: Sep. 7, 2012

(65) Prior Publication Data

US 2013/0147427 A1 Jun. 13, 2013

Related U.S. Application Data

(60) Provisional application No. 61/532,092, filed on Sep. 7, 2011.

(51) Int. Cl.
*H02J 50/05* (2016.01)
*H02J 7/02* (2016.01)
(Continued)

(52) U.S. Cl.
CPC ............ *H02J 17/00* (2013.01); *B60L 11/182* (2013.01); *B60L 11/1833* (2013.01); *H01Q 1/2225* (2013.01); *H01Q 1/273* (2013.01); *H01Q 1/3216* (2013.01); *H01Q 7/08* (2013.01); *H02J 7/0042* (2013.01); *H02J 50/05* (2016.02); *H02J 50/12* (2016.02); *H02J 50/23* (2016.02); *H02J 50/27* (2016.02); *H02J 50/40* (2016.02); *H03F 1/56* (2013.01); *H03F 3/195* (2013.01); *H03F 3/245* (2013.01); *H03F 3/305* (2013.01);
(Continued)

(58) Field of Classification Search
USPC .................... 320/108, 107, 109; 307/104
See application file for complete search history.

(56) References Cited

U.S. PATENT DOCUMENTS 3,876,980 A * 4/1975 Haemmig ............... G08G 1/20
340/991
3,984,807 A * 10/1976 Haemmig ............. H04W 64/00
340/991
(Continued)

FOREIGN PATENT DOCUMENTS

| CN | 101416411 A | 4/2009 |
|---|---|---|
| EP | 0 558 316 | 9/1993 |

(Continued)

OTHER PUBLICATIONS

"What is a Ground (Earth) Loop," Sound on Sound, Aug. 2006.*
(Continued)

*Primary Examiner* — Robert Grant
*Assistant Examiner* — John Trischler
(74) *Attorney, Agent, or Firm* — Harness, Dickey & Pierce, P.L.C.

(57) ABSTRACT

A wireless electric field power transmission system comprises: a transmitter comprising a transmitter antenna, the transmitter antenna comprising at least two conductors defining a volume therebetween; and at least one receiver, wherein the transmitter antenna transfers power wirelessly via electric field coupling when the at least one receiver is within the volume.

50 Claims, 27 Drawing Sheets

(51) Int. Cl.

| | | |
|---|---|---|
| *H02J 17/00* | (2006.01) | |
| *H02J 50/12* | (2016.01) | |
| *H02J 50/23* | (2016.01) | |
| *H02J 50/40* | (2016.01) | |
| *H02J 50/27* | (2016.01) | |
| *H03F 1/56* | (2006.01) | |
| *H03F 3/195* | (2006.01) | |
| *H03F 3/24* | (2006.01) | |
| *H03F 3/30* | (2006.01) | |
| *H02J 7/00* | (2006.01) | |
| *B60L 11/18* | (2006.01) | |
| *H03L 7/081* | (2006.01) | |
| *H01Q 1/22* | (2006.01) | |
| *H01Q 1/27* | (2006.01) | |
| *H01Q 1/32* | (2006.01) | |
| *H01Q 7/08* | (2006.01) | |
| *H04B 5/00* | (2006.01) | |
| *H02J 50/80* | (2016.01) | |
| *H02J 50/60* | (2016.01) | |

(52) U.S. Cl.
CPC ......... H03L 7/0812 (2013.01); H04B 5/0037 (2013.01); H04B 5/0081 (2013.01); *B60L 2210/10* (2013.01); *B60L 2210/30* (2013.01); *B60L 2210/40* (2013.01); *H02J 7/025* (2013.01); *H02J 50/60* (2016.02); *H02J 50/80* (2016.02); *H03F 2200/09* (2013.01); *H03F 2200/102* (2013.01); *H03F 2200/387* (2013.01); *H03F 2200/462* (2013.01); *H03F 2203/30031* (2013.01); *H03F 2203/30111* (2013.01); *H03F 2203/30114* (2013.01); *H03J 2200/06* (2013.01); *Y02T 10/7005* (2013.01); *Y02T 10/7072* (2013.01); *Y02T 10/7216* (2013.01); *Y02T 10/7241* (2013.01); *Y02T 90/12* (2013.01); *Y02T 90/121* (2013.01); *Y02T 90/122* (2013.01); *Y02T 90/125* (2013.01); *Y02T 90/127* (2013.01); *Y02T 90/14* (2013.01)

(56) References Cited

U.S. PATENT DOCUMENTS

| | | | | |
|---|---|---|---|---|
| 4,034,298 A * | 7/1977 | McFadyen | ............... | H03J 7/04 331/8 |
| 4,083,003 A * | 4/1978 | Haemmig | ............. | H04W 64/00 340/525 |
| 4,757,290 A | 7/1988 | Keren | | |
| 4,805,232 A * | 2/1989 | Ma | ..................... | H01Q 7/005 343/788 |
| 4,821,291 A * | 4/1989 | Stevens | ............. | G06K 17/0022 340/13.33 |
| 5,061,910 A * | 10/1991 | Bouny | ............. | H01F 27/2804 330/275 |
| 5,437,057 A * | 7/1995 | Richley | ............. | H04B 5/02 343/867 |
| 5,557,290 A * | 9/1996 | Watanabe | ............ | H01Q 1/1285 343/713 |
| 5,701,121 A * | 12/1997 | Murdoch | ............. | B61L 23/005 340/10.34 |
| 6,591,139 B2 * | 7/2003 | Loftin | ............. | A61N 1/37211 330/302 |
| 6,608,291 B1 * | 8/2003 | Collins et al. | ............ | 219/662 |
| 7,356,952 B2 * | 4/2008 | Sweeney | ............. | G06Q 10/087 206/573 |
| 7,519,328 B2 * | 4/2009 | Dokai | ............. | G06K 19/07749 455/334 |
| 7,595,732 B2 * | 9/2009 | Shameli | ............. | G06K 19/0723 323/223 |
| 7,668,528 B2 * | 2/2010 | Rofougaran | ....... | G06K 19/0701 327/536 |
| 8,061,864 B2 * | 11/2011 | Metcalf et al. | ............... | 362/127 |
| 8,076,801 B2 * | 12/2011 | Karalis et al. | ............... | 307/104 |
| 8,169,185 B2 * | 5/2012 | Partovi et al. | ............... | 320/108 |
| 8,294,300 B2 * | 10/2012 | Cook | ............. | H01Q 1/248 307/104 |
| 8,305,217 B2 | 11/2012 | Arimura | | |
| 8,487,478 B2 * | 7/2013 | Kirby et al. | ................. | 307/104 |
| 8,878,393 B2 * | 11/2014 | Kirby et al. | ................. | 307/104 |
| 9,142,998 B2 * | 9/2015 | Yu | ............. | H02J 7/025 |
| 9,161,160 B2 * | 10/2015 | Ikemoto | ............. | H04W 4/008 |
| 2002/0160722 A1 * | 10/2002 | Terranova et al. | ............ | 455/73 |
| 2003/0233288 A1 | 12/2003 | Sweeney et al. | | |
| 2004/0140941 A1 * | 7/2004 | Joy | ............. | H01Q 9/16 343/795 |
| 2005/0007067 A1 * | 1/2005 | Baarman et al. | ............. | 320/108 |
| 2005/0143023 A1 * | 6/2005 | Shih | ................. | 455/101 |
| 2006/0113955 A1 * | 6/2006 | Nunally | ................. | 320/108 |
| 2007/0164414 A1 * | 7/2007 | Dokai | ............. | G06K 19/07749 257/679 |
| 2008/0202003 A1 * | 8/2008 | Sweeney | ............. | G06Q 10/087 40/446 |
| 2008/0211320 A1 * | 9/2008 | Cook | ............. | H02J 17/00 307/149 |
| 2008/0265684 A1 * | 10/2008 | Farkas | ............. | B60L 11/005 307/104 |
| 2009/0045772 A1 * | 2/2009 | Cook | ............. | H02J 7/025 320/108 |
| 2009/0134712 A1 * | 5/2009 | Cook | ............. | H02J 5/005 307/104 |
| 2009/0206675 A1 * | 8/2009 | Camurati et al. | ............. | 307/104 |
| 2009/0218884 A1 * | 9/2009 | Soar | ................. | 307/11 |
| 2009/0243397 A1 * | 10/2009 | Cook | ............. | H02J 5/005 307/104 |
| 2009/0284082 A1 * | 11/2009 | Mohammadian | ............. | 307/104 |
| 2009/0299918 A1 * | 12/2009 | Cook | ............. | G06Q 30/04 705/412 |
| 2009/0302690 A1 * | 12/2009 | Kubono et al. | ................. | 307/109 |
| 2009/0303693 A1 * | 12/2009 | Mao | ................. | 361/818 |
| 2010/0081379 A1 * | 4/2010 | Cooper | ............. | H01Q 1/248 455/41.1 |
| 2010/0148723 A1 * | 6/2010 | Cook et al. | ................. | 320/108 |
| 2010/0192444 A1 * | 8/2010 | Cabahug et al. | ................. | 42/71.02 |
| 2010/0201312 A1 | 8/2010 | Kirby et al. | | |
| 2010/0277121 A1 * | 11/2010 | Hall | ............. | B60L 11/182 320/108 |
| 2011/0018498 A1 * | 1/2011 | Soar | ................. | 320/108 |
| 2011/0084656 A1 * | 4/2011 | Gao | ................. | 320/108 |
| 2011/0090030 A1 | 4/2011 | Pagani | | |
| 2011/0121658 A1 * | 5/2011 | Fukada | ................. | 307/104 |
| 2011/0198939 A1 * | 8/2011 | Karalis et al. | ................. | 307/104 |
| 2011/0234019 A1 * | 9/2011 | Camurati et al. | ................. | 307/149 |
| 2011/0241436 A1 * | 10/2011 | Furukawa | ............. | H02J 5/005 307/104 |
| 2011/0266881 A1 * | 11/2011 | Kim | ............. | H02J 5/005 307/104 |
| 2011/0266995 A1 * | 11/2011 | Winfield et al. | ................. | 320/103 |
| 2011/0267127 A1 * | 11/2011 | Staszewski et al. | .......... | 327/306 |
| 2011/0316347 A1 * | 12/2011 | Endo | ............. | H04B 5/0037 307/104 |
| 2012/0001497 A1 * | 1/2012 | Sada et al. | ............. | 307/104 |
| 2012/0010079 A1 * | 1/2012 | Sedwick | ................. | 505/163 |
| 2012/0095531 A1 * | 4/2012 | Derbas | ............. | A61N 1/0553 607/68 |
| 2012/0146431 A1 | 6/2012 | Ichikawa et al. | | |
| 2013/0147427 A1 * | 6/2013 | Polu et al. | ................. | 320/108 |
| 2013/0187475 A1 | 7/2013 | Vendik et al. | | |
| 2013/0187598 A1 * | 7/2013 | Park | ............. | H02J 7/0042 320/108 |
| 2013/0260803 A1 * | 10/2013 | Ikemoto | ............. | H04W 4/008 455/500 |
| 2014/0021907 A1 * | 1/2014 | Yu | ............. | H02J 7/025 320/108 |

(56) References Cited

U.S. PATENT DOCUMENTS

2014/0167525 A1 6/2014 Van Goor et al.
2015/0077197 A1 3/2015 Kushita et al.

FOREIGN PATENT DOCUMENTS

| EP | 0558316 A1 | * | 9/1993 | ......... A61B 18/1206 |
|---|---|---|---|---|
| JP | 2001218371 A | | 8/2001 | |
| JP | 2008193499 A | | 8/2008 | |
| JP | 2009296857 A | | 12/2009 | |
| KR | 20120048306 A | * | 5/2012 | .................... 307/104 |
| WO | WO 2009/089146 | | 7/2009 | |
| WO | WO 2009089146 A1 | * | 7/2009 | ............. G08C 17/06 |
| WO | WO-2010093719 A1 | | 8/2010 | |

OTHER PUBLICATIONS

"Motomanual RAZR V3i GSM," Motorola.com, Motorola Inc., 2006.*
Jiang et al ("A Class-B Push-Pull Power Amplifier Based on an Extended Resonance Technique," IEEE Microwave and Wireless Components Letters, vol. 13, No. 12, Dec. 2003).*
Motorola ("Motorola Razr v3i GSM," Motomanual, Motorola Inc. 2006, calculator: pp. 7, 79, 80, 104; GPRS p. 38; Radio receiver: p. 84, 88, 94, 95, 96).*
"Electromagnetic Radiation and how it affects your instruments," Field Service Memo, May 1990, OSHA Cincinnati Laboratory.*
International Search Report and Written Opinion dated Jan. 10, 2013.
Examination Report for corresponding New Zealand Application No. 623200 dated Jan. 18, 2016.
Written Opinion for corresponding Singapore Application No. 11201400409X dated Jan. 13, 2016.
Pre-Examination Notice for corresponding Australian Application No. 2012306994 dated Feb. 29, 2016.
Office Action for corresponding Chinese Application No. 201280053727.5 dated Nov. 3, 2015 and English translation thereof.
Office Action for corresponding European Application No. 12829237.2 dated Aug. 20, 2015.
New Zealand Examination Report for Application No. 623200 dated Aug. 5, 2015.
Office Action for corresponding Singapore Application No. 11201400409X dated Jun. 19, 2015.
Office Action for corresponding Singapore Application No. 11201400409X dated Nov. 28, 2014.
International Search Report PCT/ISA/210 for Internationa Application No. PCT/CA2015/050605 Dated Sep. 11, 2015.
Written Opinion of the International Searching Authority PCT/ISA/237 for International Application No. PCT/CA2015/050605 dated Sep. 11, 2015.
Written Opinion of the International Searching Authority PCT/ISA/237 for International Application No. PCT/CA2015/050855 dated Nov. 5, 2015.
International Search Report PCT/ISA/210 for International Application No. PCT/SE2015/050855 Dated Nov. 5, 2015.
Office Action for Australian Application No. 2012306994 dated Jul. 1, 2016.
Office Action for New Zealand Application No. 719870 dated Jun. 9, 2016.
International Search Report and Written Opinion dated Jun. 20, 2018.
Office Action for corresponding New Zealand Application No. 719870 dated Sep. 13, 2016.
Office Action for corresponding Japanese Application No. 2014-528811 dated Aug. 16, 2016 and English translation thereof.

* cited by examiner

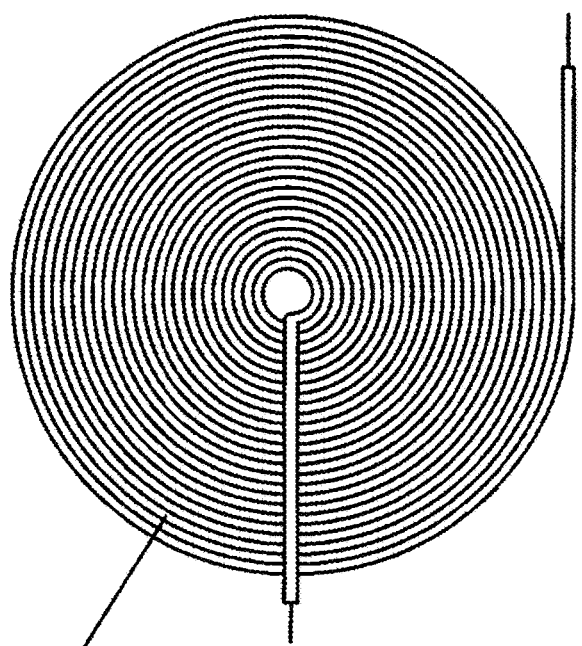
30  Figure 3a
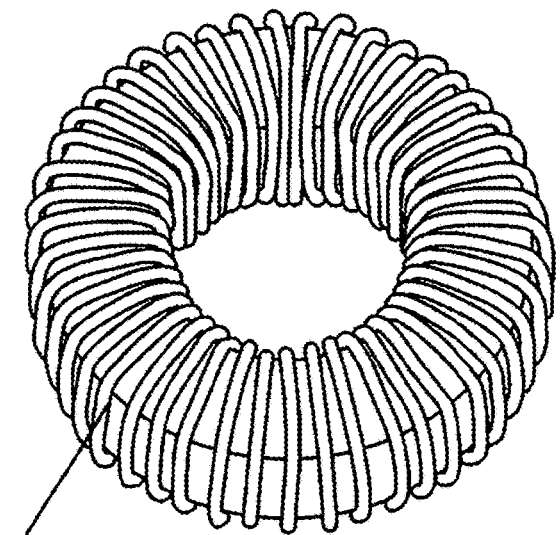
30  Figure 3b

50

64

52

52

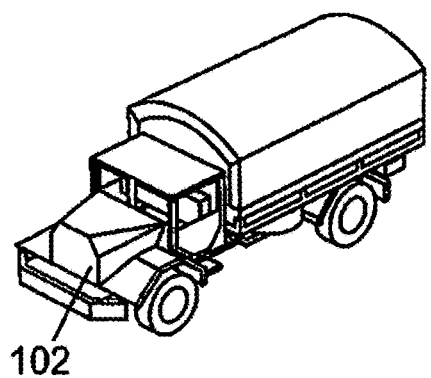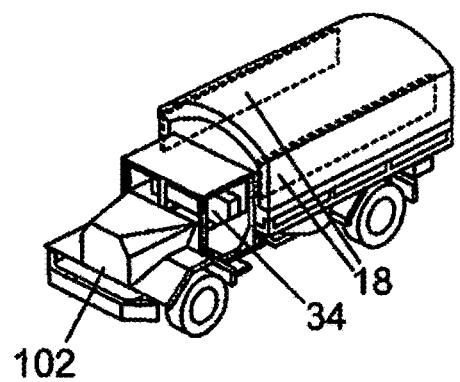
Figure 19a      Figure 19b
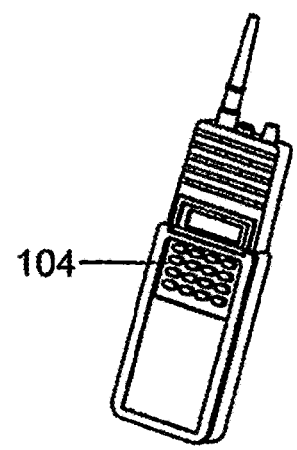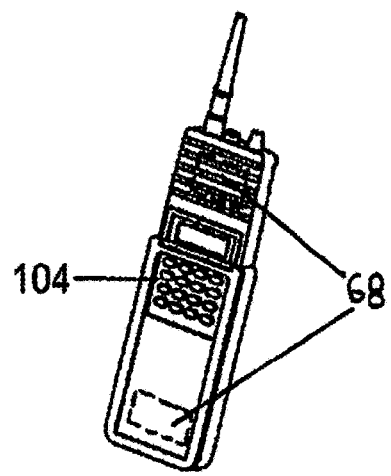
Figure 20a      Figure 20b

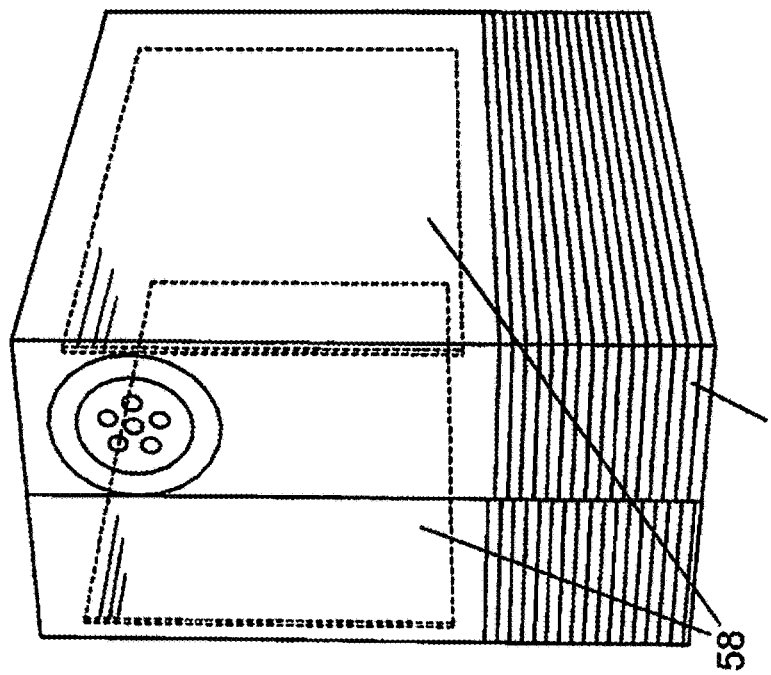
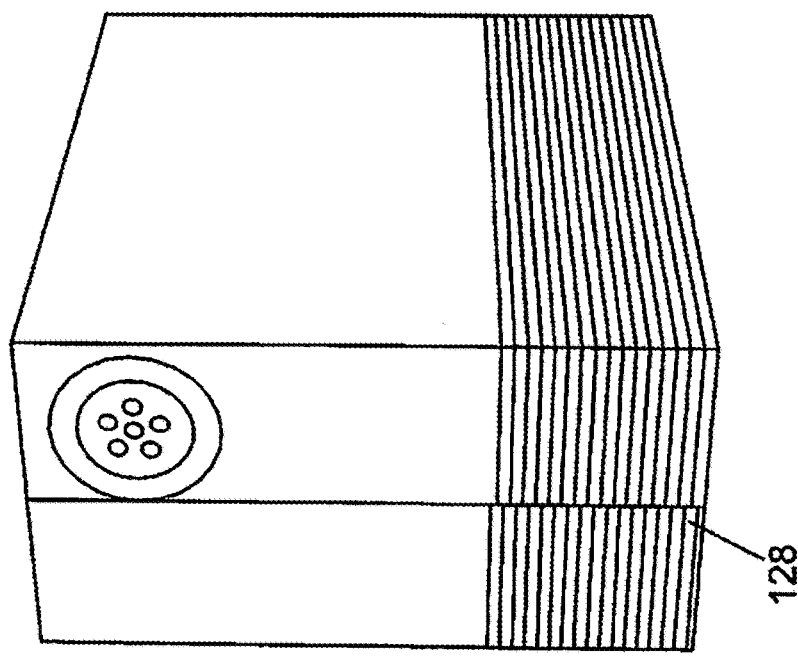
Figure 32b
Figure 32a ial pickup of the invention relates generally to wireless power

WIRELESS RESONANT ELECTRIC FIELD POWER TRANSFER SYSTEM AND METHOD USING HIGH Q-FACTOR COILS

CROSS REFERENCE TO RELATED APPLICATIONS

This application claims the benefit of U.S. Provisional Application No. 61/532,092 filed Sep. 7, 2011, the content of which is incorporated by reference in its entirety.

FIELD OF THE INVENTION

The present invention relates generally to wireless power transmission and in particular, to a wireless electric field power transmission system and method.

BACKGROUND OF THE INVENTION

A variety of radiative, or far-field, and non-radiative, or near-field, energy or power transfer techniques are known. For example, radiative wireless information transfer using low-directionality antennas, such as those used in radio and cellular communications systems and home computer networks, may be considered wireless energy transfer. As will be appreciated, this type of radiative energy transfer is inefficient because only a small portion of the supplied or radiated power, namely, that portion in the direction of, and overlapping with, the receiver is picked up. The vast majority of the power is radiated in other directions and lost in free space. Such inefficient energy transfer may be acceptable for data transmission, but is not practical when trying to transfer useful amounts of electrical energy for the purpose of doing work, such as for example, powering or charging electrical devices. One way to improve the transfer efficiency of some radiative energy transfer schemes is to use directional antennas to confine and preferentially direct a beam of radiated energy towards a receiver. However, these directed radiation schemes typically require an uninterruptible line-of-sight between the transmitter and receiver as well as potentially complicated tracking and steering mechanisms in the case of mobile transmitters and/or receivers. In addition, such directed radiation schemes may pose hazards to objects or people that cross or intersect the beam of radiated energy when modest to high amounts of power are being transmitted.

A known non-radiative, or near-field, wireless power transmission system, often referred to as either induction or traditional induction, does not (intentionally) radiate power, but instead uses an oscillating current passing through a primary coil, to generate an oscillating magnetic near-field that induces currents in a near-by receiving or secondary coil. Induction schemes of this nature have demonstrated the transmission of modest to large amounts of power, however only over very short distances, and with very small offset tolerances between the primary coil and the secondary coil. Electric transformers and proximity chargers are examples of devices that utilize this known short range, near-field energy transfer scheme.

PCT Application Publication No. WO 2009/089146 discloses a wireless power transmission system that includes a transmitter and a receiver. The transmitter includes a radio frequency energy generator, a first transmitting plate, and a second transmitting plate. The first transmitting plate is operatively coupled to the radio frequency energy generator. The second transmitting plate is operatively coupled to a ground. The receiver includes a rectifier, a first receiving plate, and a second receiving plate. The first receiving plate is operatively coupled to the rectifier. The first receiving plate is configured to be capacitively coupled to the first transmitting plate and the second receiving plate is configured to be capacitively coupled to the second transmitting plate. The second receiving plate is operatively coupled to a ground.

U.S. Patent Application Publication No. 20110198939 discloses embodiments of a transmitter that includes a substantially two-dimensional high-Q resonator structure including a flat coil and an impedance-matching structure operably connected to the resonator structure. The transmitter is configured to transmit power wirelessly to another high-Q resonator.

U.S. Patent Application Publication No. 20090206675 discloses a means for transporting electrical energy and/or information from a distance by using, at a slowly varying regime, the Coulomb field which surrounds any set of charged conductors. A device is composed of energy production and consumption devices situated a short distance apart, and it uses neither the propagation of electromagnetic waves nor induction and cannot be reduced to a simple arrangement of electrical capacitors. The device is modeled in the form of an interaction between oscillating asymmetric electric dipoles, consisting of a high-frequency high-voltage generator (1) or of a high-frequency high-voltage load (5) placed between two electrodes. The dipoles exert a mutual influence on one another. The device is suitable for powering industrial and domestic electrical apparatus and is especially suitable for powering low-power devices moving in an environment and for short-distance non-radiating transmission of information.

Although wireless power transmission techniques are known, improvements are desired. It is therefore an object of the present invention to provide a novel wireless electric field power transmission system and method.

SUMMARY OF THE INVENTION

Accordingly, in one aspect there is provided a wireless electric field power transmission system comprising: a transmitter; a transmitter antenna connected to the transmitter, the transmitter antenna comprising at least two conductors defining a volume therebetween; and at least one receiver, wherein the transmitter antenna transfers power wirelessly via electric field coupling when the at least one receiver is within the volume.

According to another aspect there is provided a method for wirelessly transmitting power, the method comprising: oscillating a transmitter antenna comprising at least two conductors defining a volume at a transmitter resonant frequency; generating an electric field in the volume; positioning a receiver antenna comprising two plates in the volume; and oscillating the receiver antenna at the transmitter resonant frequency.

According to yet another aspect there is provided a method for wirelessly transferring power, the method comprising: resonating a transmitter antenna comprising at least two conductors and a transmitter coil at a start-up frequency; tuning the transmitter antenna and the transmitter coil to their resonant frequency; generating an electric field within a volume defined by the at least two conductors; placing a receiver with a receiver antenna comprising two plates in the volume; accumulating a potential difference on the two plates; resonating the receiver antenna at the resonant frequency; and gathering power from the receiver antenna.

According to yet another aspect there is provided a transmitter for wirelessly transmitting power, the transmitter comprising: an antenna for creating an electric field, the antenna comprising at least two conductors defining a volume therebetween; a coil connected to the antenna; and a resonator connected to the coil for resonating the coil and the antenna at a resonant frequency, the resonator comprising an auto frequency tuning circuit for automatically tuning the resonator to the resonant frequency.

The antenna may comprise at least two generally parallel plates that are laterally spaced to define the volume.

The antenna may comprise six conductors defining the volume.

The antenna may be a near-field antenna.

Each conductor may be formed of conductive tape.

The coil may be constructed using strand wire.

The coil may be a toroid spiral, cylindrical spiral, flat spiral or pancake coil.

The auto frequency tuning circuit may further comprise circuitry configured to boost a signal to the antenna. The circuitry may comprise at least one of a voltage gain, a current gain and a power amplifier. The power amplifier may be a push-pull power amplifier.

The auto frequency tuning circuit may further comprise a delay line configured to delay the signal within the auto frequency tuning circuit. The delay line may be an active inverter delay chain comprising complementary metal-oxide-semiconductor (CMOS) inverters connected in series.

The auto frequency tuning circuit may further comprise a decoupling circuit configured to decouple an output signal of the transmitter. The decoupling circuit may comprise a balun.

The auto frequency tuning circuit may further comprise a current sensing circuit configured to provide a feedback signal.

The auto frequency tuning circuit may further comprise an oscillator configured to inject a start-up signal into the auto frequency tuning circuit.

The resonator may further comprise modification circuitry configured to modify the output signal of the transmitter when a condition occurs. The modification circuitry may adjust the power level of the output signal when the condition occurs. The modification circuitry may shut off output of the transmitter when the condition occurs.

In one embodiment, there is provided a vehicle comprising the transmitter of the present aspect.

In another embodiment, there is provided a table comprising the transmitter of the present aspect.

In another embodiment, there is provided a container comprising the transmitter of the present aspect. The container may be shielded to prevent electromagnetic field (EMF) leakage. Electric field strength may be increased when the container is closed.

According to still yet another aspect there is provided a receiver for receiving wirelessly transmitted power, the receiver comprising: an antenna comprising two conductors; a coil connected to the antenna; a resonator connected to the coil for resonating the coil and the antenna at a resonant frequency, the resonator comprising an auto frequency tuning circuit for automatically tuning the resonator to the resonant frequency.

The conductors may be external to a housing accommodating the coil and the resonator.

The conductors may be plates or rails. The rails may be rectangular and parallel. The rails may be metallic.

The coil may be constructed of strand wire or inductors.

The coil may be a toroid, cylindrical spiral, flat spiral or pancake coil.

The resonator may further comprise modification circuitry configured to modify a signal received by the receiver when a condition occurs. The modification circuitry may adjust the signal received by the receiver when the condition occurs. The modification circuitry may be a voltage converter and/or a rectifier.

The receiver may further comprise an impedance matching circuit. The impedance matching circuit may comprise a balun.

In one embodiment, there is provided a backpack for receiving wirelessly transmitted power, the backpack comprising the receiver of the present aspect. The backpack may further comprise a battery charger connected to the receiver. The backpack may further comprise at least one rechargeable battery connected to the receiver configured to charge when no batteries are present in the battery charger.

In another embodiment, there is provided a radio communication device for receiving wirelessly transmitted power, the device comprising the receiver of the present aspect.

In another embodiment, there is provided a computing device for receiving wirelessly transmitted power, the device comprising the receiver of the present aspect.

In another embodiment, there is provided a device comprising the transmitter of the previous aspect, and the receiver of the present aspect.

According to still yet another aspect there is provided a wireless electric field power transmission system comprising: a transmitter; a transmitter antenna connected to the transmitter, the transmitter antenna comprising at least one conductor; and at least one receiver, wherein the transmitter antenna transfers power wirelessly via electric field coupling when the at least one receiver is coupled to the transmitter.

BRIEF DESCRIPTION OF THE DRAWINGS

Embodiments will now be described more fully with reference to the accompanying drawings in which:

FIG. 3a is a top plan view of a transmitter coil forming part of the transmitter of FIG. 2;

FIG. 3b is a perspective view of another embodiment of the transmitter coil of FIG. 3a;

FIG. 3c is a perspective view of another embodiment of the transmitter coil of FIG. 3a;

FIG. 5b is a circuit diagram of the components of FIG. 5a;

FIG. 11b is a perspective view of another embodiment of the receiver coil of FIG. 11a;

FIG. 11c is a top plan view of another embodiment of the receiver coil of FIG. 11a;

FIGS. 19a and 19b are perspective views of a vehicle equipped with a transmitter and transmitter antenna;

FIGS. 20a and 20b are perspective views of a radio equipped with a receiver and receiver antenna;

FIGS. 32a and 32b are perspective views of a battery equipped with a receiver and receiver antenna;

DETAILED DESCRIPTION OF THE EMBODIMENTS

Figure 1:
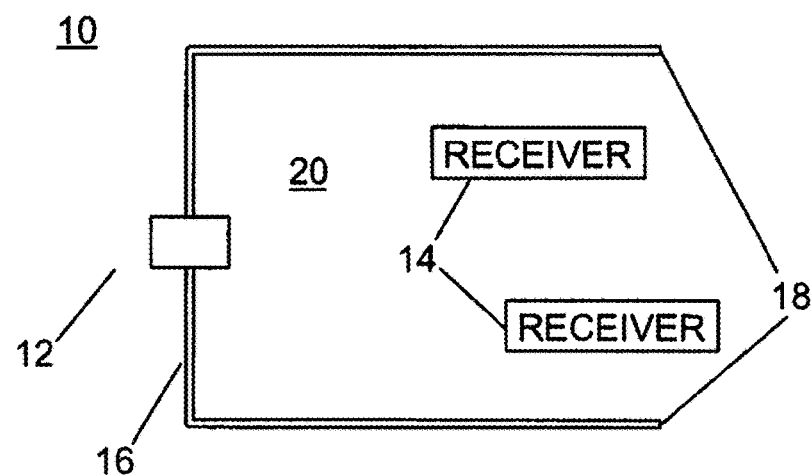
FIG. 1 is a schematic layout view of a wireless electric field power transmission system.

Turning now to FIG. 1, a wireless electric field power transmission system is shown and is generally identified by reference numeral 10. As can be seen, power transmission system 10 comprises a transmitter 12 comprising a transmitter antenna 16 coupled and a plurality of receivers 14. Although only two receivers 14 are shown, it will be appreciated that this is for ease of illustration only. The power transmission system 10 may comprise more or fewer receivers 14. The transmitter antenna 16 comprises two approximately parallel, laterally spaced conductors 18 defining a volume 20 between them. The conductors 18 are elongate and generally rectangular and are oriented such that major surfaces of the conductors face one another. In this embodiment, each conductor 18 is formed of aluminum foil tape due to its flexibility, low cost and availability. Each receiver 14 can be positioned within the volume 20 to harvest power wirelessly as a result of an electric field generated within the volume 20 by the transmitter antenna 16.

Figure 2:
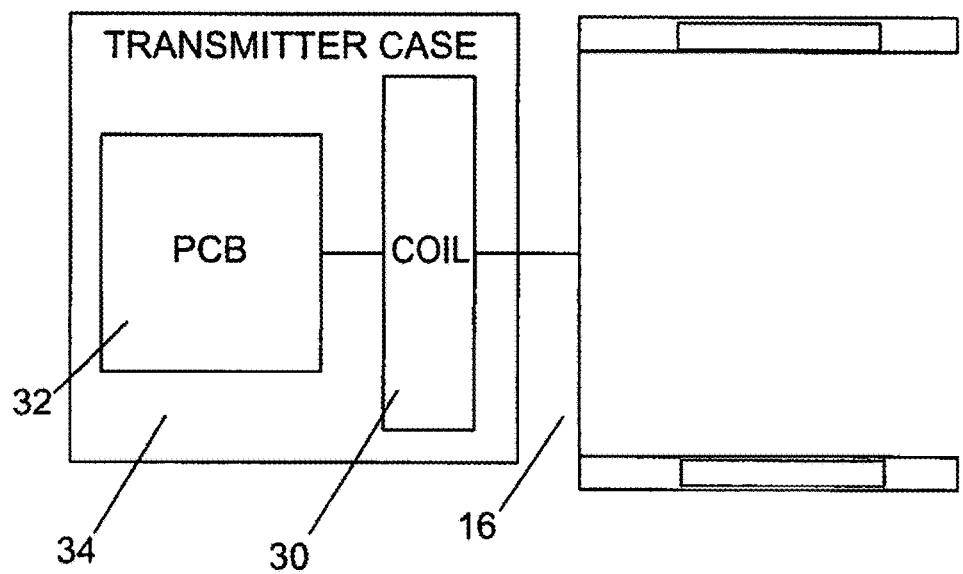
FIG. 2 is schematic layout view of a transmitter and transmitter antenna forming part of the wireless electric field power transmission system of FIG. 1.

Turning now to FIG. 2, the transmitter 12 comprising the transmitter antenna 16 are better illustrated. The transmitter 12 further comprises a transmitter coil 30 and a resonator 32 connected to the transmitter coil 30 for resonating the coil 30 and the transmitter antenna 16 at a resonant frequency. The components of the resonator 32 are mounted on a printed circuit board (PCB) or other suitable substrate. A transmitter case or housing 34 houses the transmitter coil 30 and the resonator 32.

In this embodiment, the transmitter coil 30 is a flat spiral or pancake coil as seen in FIG. 3a and is constructed using 14 AWG (American Wire Gauge) insulated solid copper wire. The transmitter coil 30 has forty-eight (48) turns and a diameter of approximately fifteen (15) inches (37.5 cm). The operating frequency of the transmitter coil 30 is one (1) MHz and the inductance of the transmitter coil is two hundred and eighty (280) uH. The transmitter coil 30 has a quality factor (Q-factor) of two hundred (200). The transmitter coil 30 is configured to create a high Q-factor resonance with the conductors 18 of the transmitter antenna 16 at its operating frequency.

Figure 4:
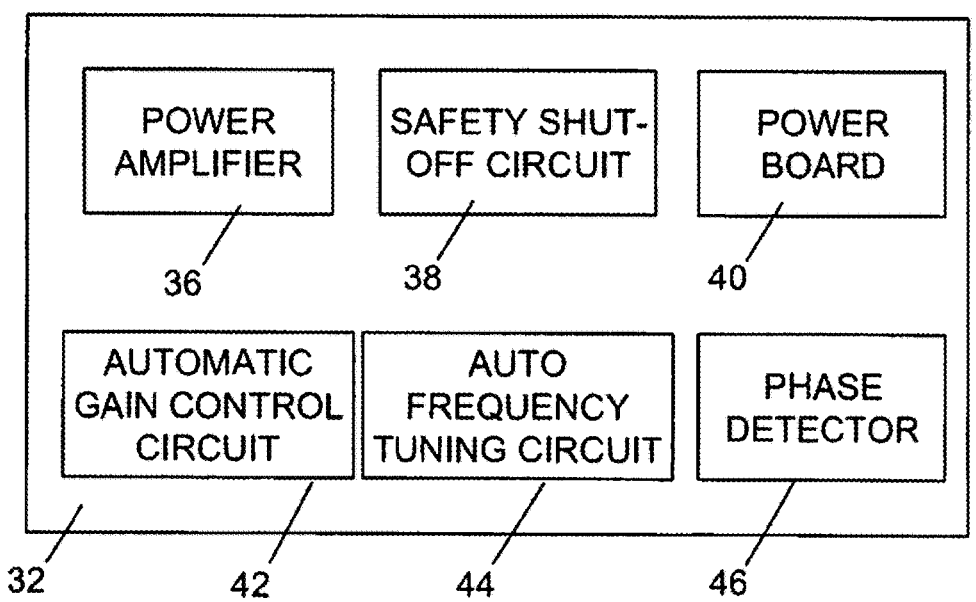
FIG. 4 is a block diagram of a printed circuit board accommodating components of the transmitter of FIG. 2.
Figure 5A:
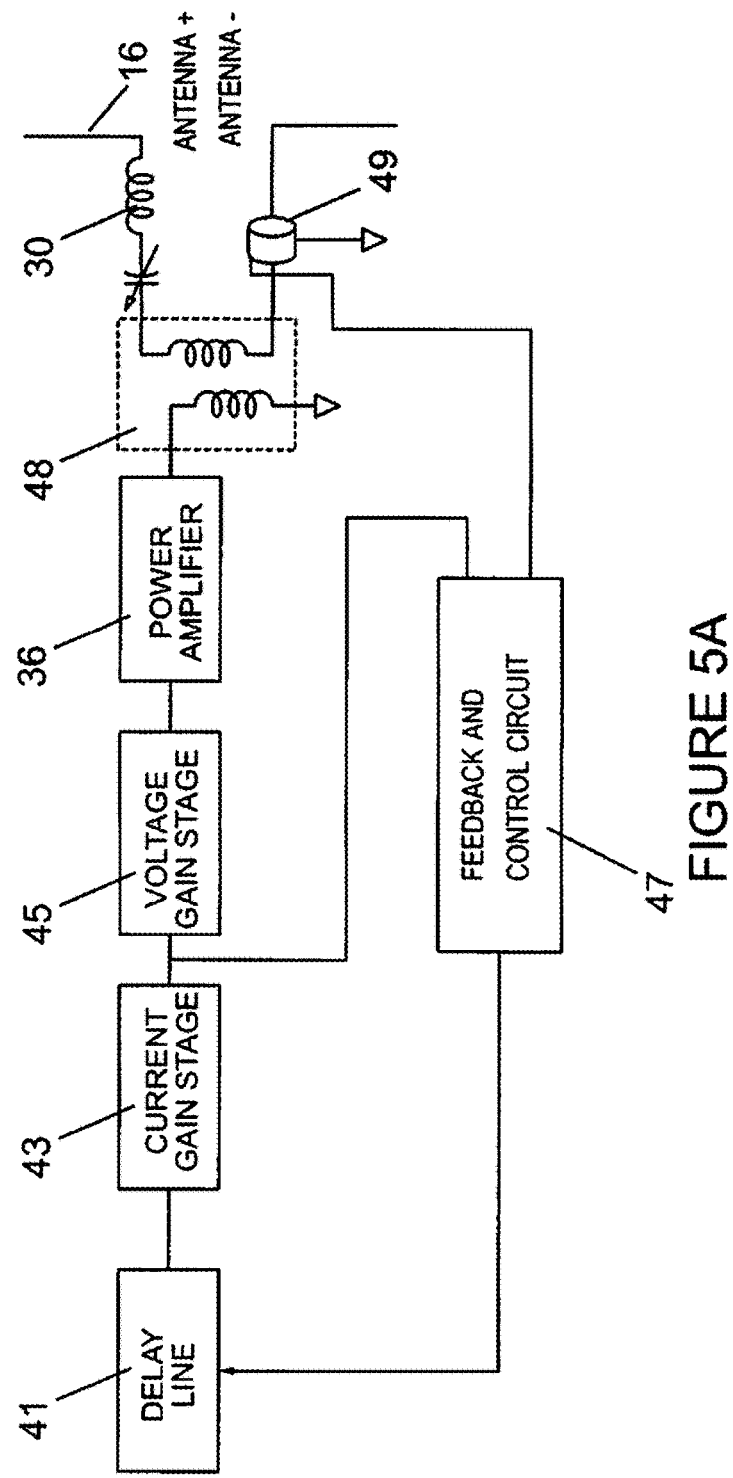
FIG. 5a is a block diagram of components of the transmitter of FIG. 2.

Turning now to FIG. 4, the resonator 32 is better illustrated. As can be seen, the resonator 32 in this embodiment comprises a power amplifier 36, a safety shut-off circuit 38, a power board 40, an automatic gain control (AGC) circuit 42, an auto frequency tuning (AFT) circuit 44 and a phase detector 46. The power amplifier 36, AFT circuit 44 and phase detector 46 are further illustrated in FIG. 5a. These components are configured to automatically detect and tune to the frequency of power transmitted by the transmitter antenna 16 to enhance or optimize wireless electric field power transfer to receivers 14 positioned within the volume 20 as will be described. The circuitry comprises a delay line 41, a current gain stage 43 and a voltage gain stage 45 connected in series. The voltage gain stage 45 is connected to the power amplifier 36. A decoupling circuit in the form of a balun 48 is connected between the power amplifier 36 and the transmitter coil 30 to decouple the power amplifier output from ground. A current sensor in the form of a current sensing toroid 49 senses the current output by the balun 48. The current sensing toroid 49 and the current gain stage 43 provide output to a feedback and control circuit 47.

Figure 5B:
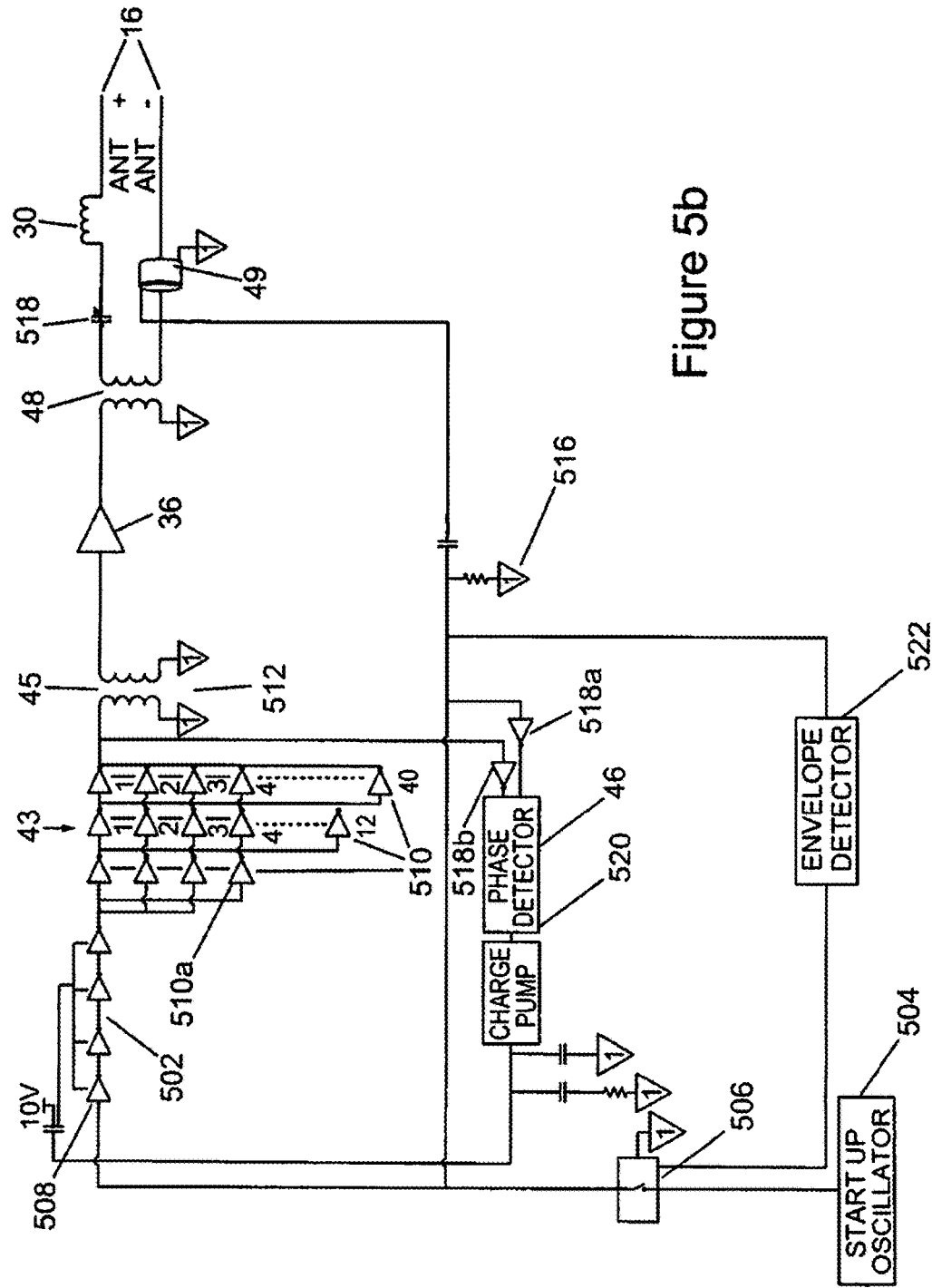

As shown in FIG. 5b, the delay line 41 is implemented using an active inverter delay chain 502 that receives input from a start-up oscillator 504 via a normally closed semiconductor switch 506. The inverter delay chain 502 comprises a plurality of complementary metal-oxide-semiconductor (CMOS) inverters 508 connected in series. The inverter delay chain 502 is connected to the current gain stage 43 which comprises a plurality of current boosting inverting stages 510 arranged in parallel. In this embodiment, the current gain stage 43 comprises three (3) inverting stages 510. The last inverting stage 510 comprises forty (40)

CMOS inverters 510a, the middle inverting stage 510 comprises twelve (12) CMOS inverters 510a and the first inverting stage 510 comprises four (4) CMOS inverters 510a. The outputs of the inverters 510a of the last inverting stage 510 are coupled and connected to the voltage gain stage 45 which in this embodiment is a wideband transformer 512. The wideband transformer 512 has a turn ratio of 1:4. The last inverting stage 510 of the current gain stage 43 is connected to one coil of the wideband transformer 512. The other coil of the wideband transformer 512 is connected to the power amplifier 36. The output of the power amplifier 36 is coupled to one coil of the balun 48. The balun 48 in this embodiment has a ferrite core and a turn ratio of slightly higher than 1:1 for impedance matching purposes. The ferrite core balun has been found to provide twice as much current as an air balun and greater efficiency. The other coil of the balun 48 provides balanced differential output ports. One output port of the balun 48 is connected to the transmitter coil 30 via a tuning capacitor 518. The other output port of the balun 48 passes through the current sensing toroid 49 and is connected to the transmitter antenna 16.

The current sensing toroid 49 provides a feedback signal to the active inverter delay chain 502 as part of the feedback and control circuit 47 via an RC network 516 and to the phase detector 46 via the RC network 516 and an inverter 518a. Phase detector 46 also receives the output of the current gain stage 43 via an inverter 518b. Phase detector 46 functions with a charge pump 520 to keep the start-up oscillator 504 in phase and frequency lock. The current sensing toroid 49 also provides the feedback signal to an envelope detector 522 via the RC network 516 which in turn provides output to the normally closed semiconductor switch 506.

Figure 6:
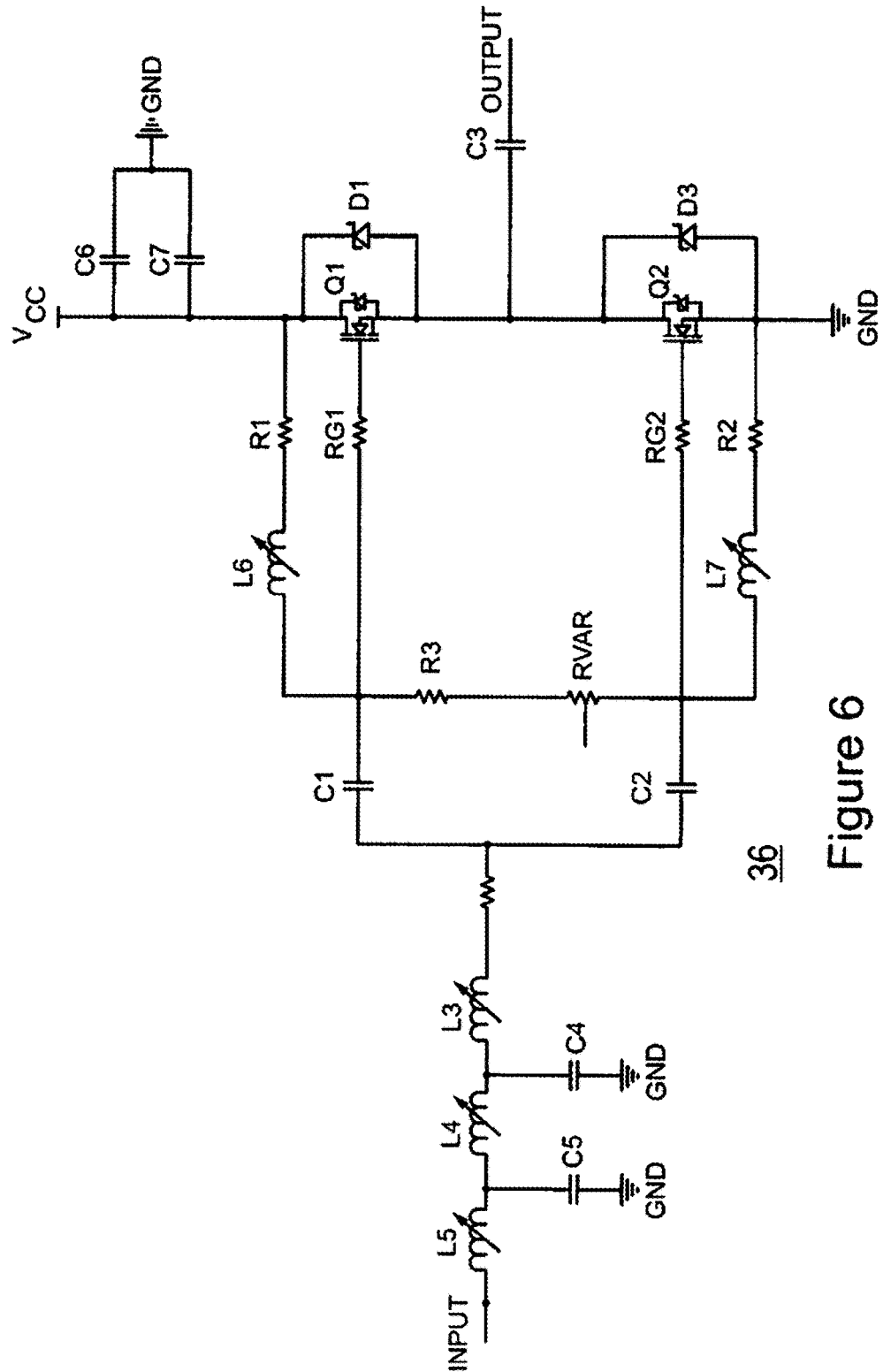
FIG. 6 is a circuit diagram of a power amplifier forming part of the transmitter of FIG. 2.

The power amplifier 36 in this embodiment, as shown in FIG. 6, is a class-AB push-pull power amplifier and is used to increase the signal input thereto by a factor of at least eighty (80) (approximately nineteen (19) dB), which is then delivered to the transmitter coil 30 via the balun 48.

The safety shut-off circuit 38 is an automatic shut-off circuit that determines when people, animals or other living organisms are present in the volume 20 and reduces the strength of or stops power transmitted by the transmitter antenna 16. The safety shut-off circuit 38 also shuts off power to the transmitter 12 in the event of an overload caused by shorting, thermal runaway or any other such occurrence. In this embodiment, the safety shut-off circuit 38 is implemented using an operational amplifier (Op-amp) (not shown), a semiconductor switch (not shown) in the form of a metal-oxide-semi-conductor field-effect transistor (MOSFET) and an envelope detector (not shown). The envelope detector monitors the output of the transmitter 12 and sends a signal to the Op-amp when a sudden change in output current or voltage is detected. The Op-amp in response transmits a signal to the semiconductor switch which shuts down the resonator 32 by isolating the resonator from input power.

The power board 40 comprises a plurality of high efficiency voltage regulators (not shown) that convert conventional AC mains power into DC power that is used to power the various components of the transmitter 12.

The AGC circuit 42 is used in conjunction with the power amplifier 36 to control the output power transmitted. The AGC circuit 42 is a radio frequency (RF) circuit having absolute values of power which are dependent on the required level of safety. In this embodiment, the AGC circuit 42 is implemented using an Op-amp (not shown), a semiconductor switch (not shown) in the form of a MOSFET and an envelope detector (not shown). The envelope detector monitors the output of the transmitter 12 and when the output exceeds a threshold value, sends a signal to the Op-amp. The Op-amp in response sends an appropriate signal to the semiconductor switch causing the semiconductor switch to limit the power output of the power amplifier 36.

Figure 7:
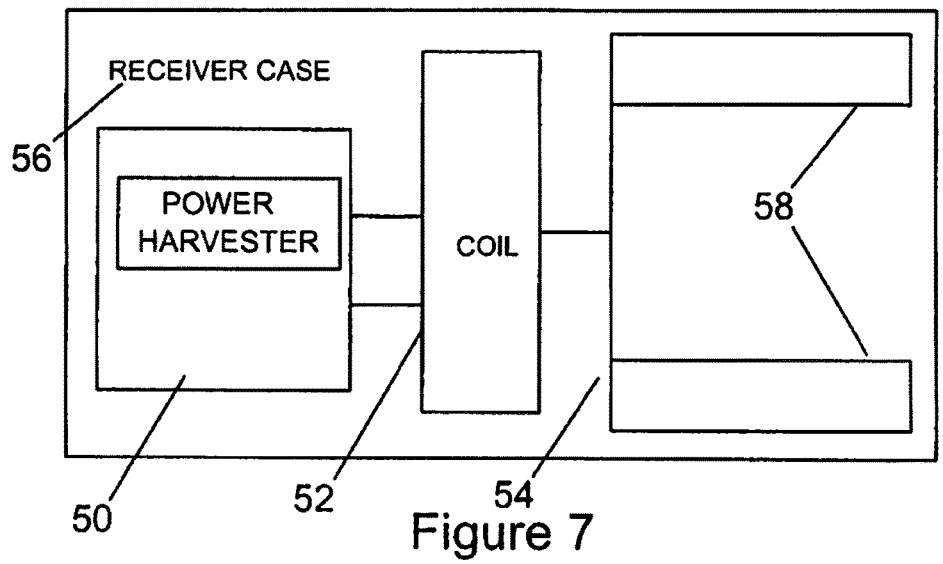
FIG. 7 is a schematic layout view of a receiver forming part of the wireless electric field power transmission system of FIG. 1.

Turning now to FIG. 7, one of the receivers 14 is better illustrated. As can be seen, receiver 14 comprises a high Q-factor receiver coil 52, a receiver antenna 54 that is connected to the receiver coil 52 and a power harvester 50 connected to the receiver coil 52. The components of the power harvester 50 are mounted on a printed circuit board (PCB) or other suitable substrate. The receiver antenna 54, receiver coil 52 and power harvester 50 are accommodated by a receiver case or housing 56. The power harvester 50 includes connectors and jacks from which received power is output. Devices requiring power can be connected to these connectors and jacks.

Figure 8:
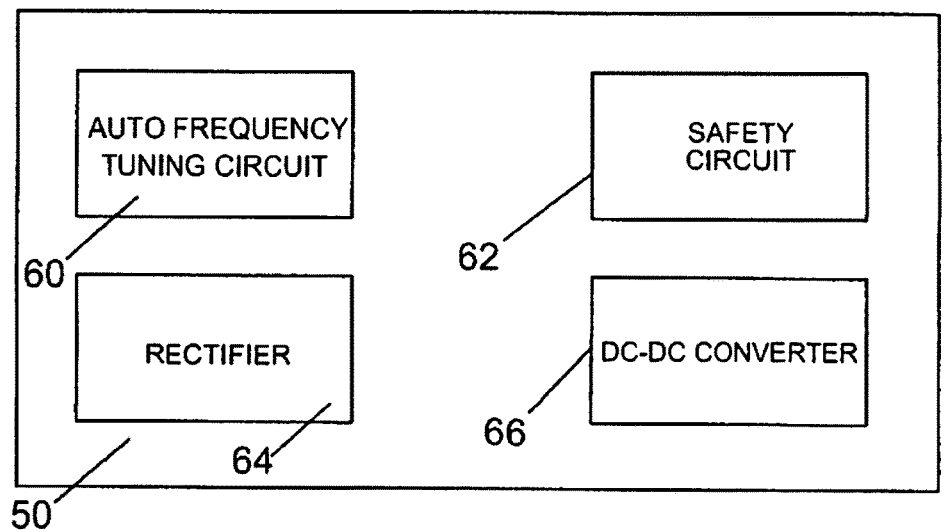
FIG. 8 is a block diagram of a printed circuit board accommodating components of the receiver of FIG. 7.
Figure 9:
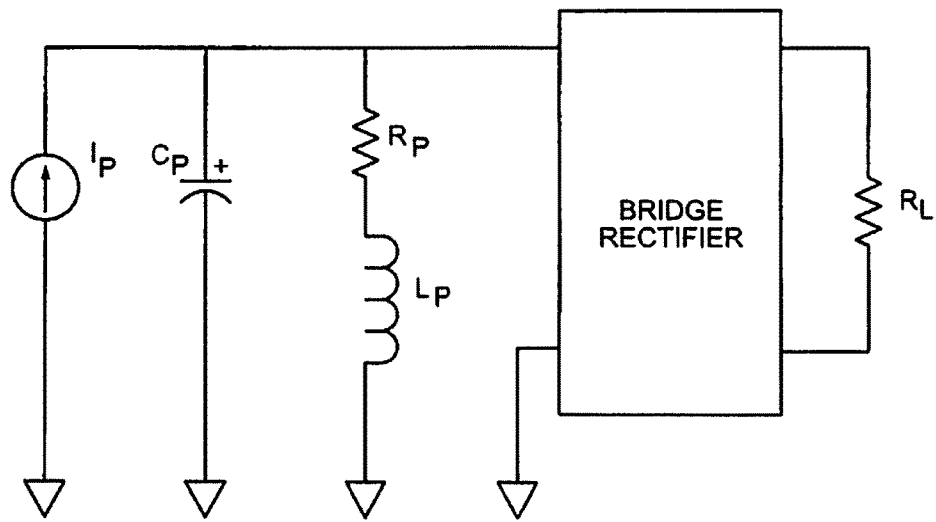
FIG. 9 is a circuit diagram of components of the receiver of FIG. 7.

FIG. 8 better illustrates the power harvester 50. As can be seen, power harvester comprises a receiver auto frequency tuning (AFT) circuit 60, a receiver safety circuit 62, a bridge rectifier 64, a DC-DC voltage converter 66 and a receiver power supply (not pictured). The AFT circuit 60 is similar to the transmitter AFT circuit 32 shown in FIG. 5b and is configured to resonate the receiver antenna 54 and coil 52. The receiver power supply powers the AFT 60 circuit. A portion of the circuit layout of the power harvester 50 is shown in FIG. 9. The device connected to the receiver 14 is modeled as an inductor $L_p$ in series with a resistor $R_p$ which are both in parallel with a capacitor $C_p$. The DC-DC voltage converter 66 is not shown in FIG. 9.

Figure 10:
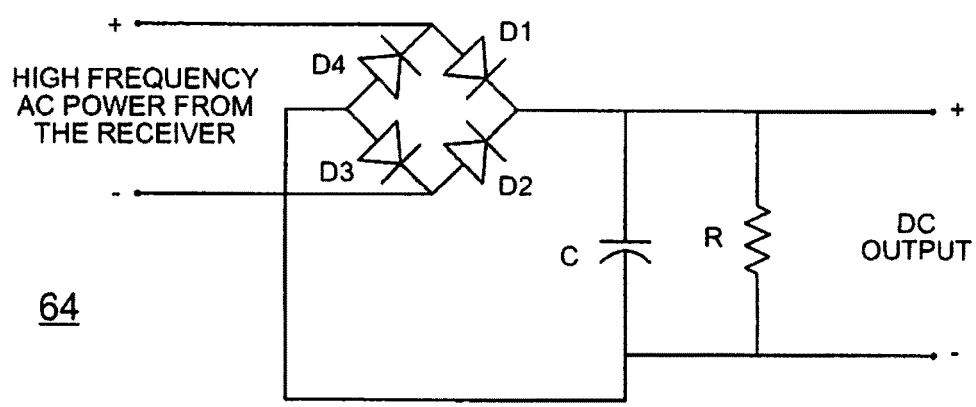
FIG. 10 is a circuit diagram of a rectifier forming part of the receiver of FIG. 7.

The output voltage across the high Q-factor resonant receiver coil 52 results in an AC voltage. The voltage is rectified by the bridge rectifier 64 which is connected to an output of the receiver coil 52. The bridge rectifier 64 is shown in FIG. 10 and converts the received AC voltage to a DC voltage which is in the order of kilovolts. The bridge rectifier 64 employs ultra-fast diodes $D_1$ to $D_4$ that have a low junction capacitance, a high reverse breakdown voltage and low forward voltage drop.

The DC-DC voltage converter 66 has a high conversion ratio and performs a DC-DC down-conversion to reduce the rectified voltage output by the bridge rectifier 64 to useable levels. For example, if a 0.5 W high AC signal is rectified by the bridge rectifier 64, it will have a four hundred (400) V potential and one (1) mA of current. Down-converting this rectified output voltage to a more useable form such as for example, a five (5) V and eighty (80) mA output is beneficial in particular applications. In this embodiment, the maximum input voltage of the DC-DC voltage converter 66 is greater than one thousand (1000) V while the output voltage is between five (5) V and fourteen (14) V with a power rating of one (1) W to four (4) W. The output of the bridge rectifier 64 is connected to the DC-DC voltage converter 66 (not shown) which then outputs the converted power to the device requiring power through jacks and connectors.

The receiver safety circuit 62 automatically shuts off the receiver 14 if an electric field is detected that is higher than the standard safety limits. The receiver safety circuit 62 also disables DC power to any device connected to the receiver 14 if a short circuit load is detected.

The receiver antenna 54 in this embodiment comprises two generally rectangular, approximately parallel conductors which in this embodiment are conductive plates 58. The distance between the two plates 58 is approximately equal to the average dimension of each plate 58. The plates 58 may either be rigid or flexible. The receiver antenna 54 has a low capacitance (approximately seven (7) pf to nine (9) pf) relative to its dimension and the received signal wavelength. When resonant, the receiver antenna 54, the power harvester 50 harvests electrical power through the electric field created within the volume 20 between the conductors 18 of the transmitter antenna 16. As will be appreciated, the receiver 14 is small relative to the amount of power it can harvest within the volume 20.

Figure 11A:
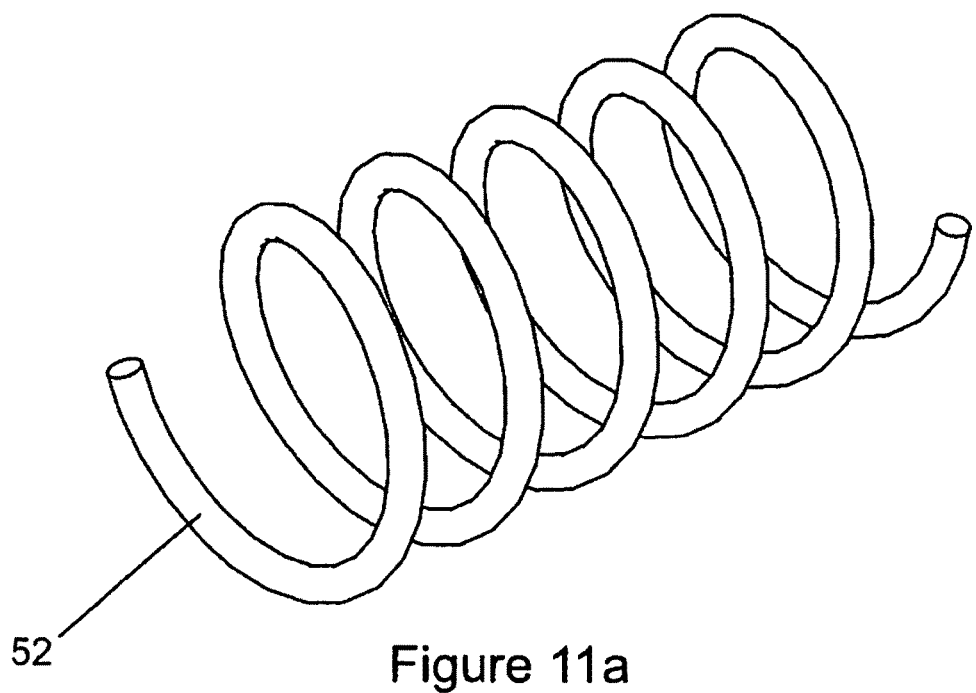
FIG. 11a is a perspective view of a receiver coil forming part of the receiver of FIG. 7.

The receiver coil 52 in this embodiment is a cylindrical spiral coil as illustrated in FIG. 11a. The receiver coil 52 is constructed of insulated, solid copper wire and has a diameter of approximately four (4) inches (twelve (12) cm). The receiver coil 52 is positioned adjacent to the two plates 58.

In general, during operation the transmitter 12 is operated so that it drives the transmitter antenna 16 causing an electric field to be generated within the volume 20 between the conductors 18 by running opposite phase, equal magnitude currents through the conductors 18. When a receiver 14 is positioned within the volume 20, the receiver antenna 54 begins to oscillate at the resonant frequency resulting in wireless power being transmitted from the transmitter 12 to the receiver 14 via electric field coupling.

The closed-loop architecture of the transmitter 12 ensures the transmitter 12 automatically oscillates at the resonant frequency of the transmitter antenna-transmitter coil pair at all times. In particular, initially the start-up oscillator 504 is used to inject a start-up signal that is applied to the inverter delay chain 502 of the delay signal line 41. The current level of the signal is then boosted by the current gain stage 43 and applied to the power amplifier 36 via the wideband transformer 512 of the voltage gain stage 45. The output of the power amplifier 36 is then applied to the balun 48 which decouples the signal from ground and provides output to the transmitting coil 30 via the tuning capacitor 518. The transmitting coil 30 in turn drives the transmitter antenna 16 resulting in the electric field being generated within the volume 20. The feedback signal output by the current sensing toroid 49, which senses the current in the transmitter antenna 16, is used by the envelope detector 520 to condition the semiconductor switch 520 to isolate the start-up oscillator 504 from the inverter delay chain 502. As a result, the feedback signal that is applied to the inverter delay chain 502 is used to sustain the transmitter output. As will be appreciated, by generating the feedback signal using the current sensing toroid 49 that senses the current running through the transmitter antenna 16 and feeding the signal back into the transmitter 12, the transmitter 12 automatically oscillates at the resonant frequency of the transmitter antenna-transmitter coil pair.

As will be appreciated, the transmitter 12 has a fast self-tuning and compact design. Because the transmitter 12 automatically oscillates at the resonant frequency of the transmitter antenna-transmitter coil pair, the transmitter antenna 16 stays tuned and does not require hand tuning or automatic tuning circuitry. Also, the transmitter 12 does not require a pre-amplifier or a digital control system to perform automatic frequency tuning.

Figure 12:
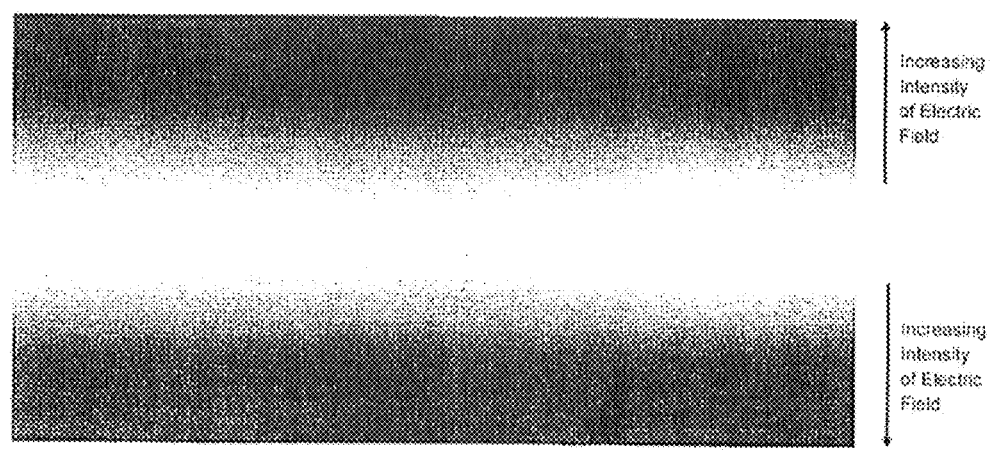
FIG. 12 shows the intensity of an electric field generated by the transmitter and transmitter antenna of FIG. 2.

As mentioned above, when the transmitter coil 30 drives the transmitter antenna 16, the electric field (a reactive near field) is created within the volume 20 which can be used by each receiver 14 positioned within the volume to harvest power. An exemplary electric field generated within the volume 20 is shown in FIG. 12. As can be seen, the intensity of the electric field increases towards the conductors 18 and weakens towards the middle of the volume 20. Greater efficiency wireless power transfer to a receiver 14 is therefore achieved when the receiver is closer to the conductors 18 and lower efficiency wireless power transfer to the receiver 14 is achieved when the receiver is positioned near the center of the volume 20. Thus, the power radiated is determined by the separation between conductors 18 rather than conductor length.

The high Q-factor of the transmitter 12 limits the amount of power that an unintentional sink (such a human body within the volume) can recover from the transmitter 12. When an unintentional sink enters the volume 20, the generated electric field is no longer resonant with the receiver 14, due to the sink disrupting the resonance, causing a drop in the power of the electric field such that the total power dissipated into the sink is less than regulatory limits, in the case of a human body.

When a receiver 14 is positioned within the volume and the electric field is present, a voltage is observed across the plates 58 of the receiver antenna 54 as a result of electric charge accumulation on the two plates 58. The resonating of the receiver antenna 54 by the AFT circuit 60 allows power to be harvested. In particular, when the receiver antenna 54 is made resonant by the AFT circuit 60, the amount of charge flowing from one plate 58 to the other plate 58 is multiplied by the resonance Q-factor, resulting in a high frequency AC signal that is converted to a DC signal via the rectifier 64. The DC signal is then down-converted by the DC-DC voltage converter 66 to a desired voltage and current depending on the application. The signal output by the DC-DC voltage converter is then received by the device modeled by the RLC circuit ($R_p$, $L_p$ and $C_p$).

The output power of the receiver 14 depends on the strength of the electric field available at the receiver 14, the distance between the two plates 58 of the receiver antenna 54, and the Q-factor of the receiver coil 52.

The strength of the electric field available at the receiver 14 changes depending on the position of the receiver 14 relative to the conductors 18. As previously stated, the electric field is weakest at the midpoint of the volume 20 between the two conductors 18. The receiver antenna 54 emits very small amounts of radiation and almost all the electric field created by the transmitter antenna 16 is reactive (i.e. non-radiating). Thus, large amounts of power can be wirelessly transmitted to the receiver 14 without violating electric field emission limits in the respective frequency bands. Field emission limits in Canada can be found in the Health Canada safety code 6 and field emission limits in the U.S. can be found in IEEE standard C95.1-2005.

The wireless power harvesting efficiency is affected by the orientation of the plates 58 relative to the electric field within the volume 20. Since the electric field varies with distance, having the two plates 58 separated by a distance along the electric field direction (i.e. the common axis of the two plates 58 is along the direction of the electric field) creates a potential difference between the plates 58 when they are placed within the electric field. When the common axis of the two plates 58 is perpendicular to the direction of the electric field, the two plates 58 are almost at the same potential which will significantly reduce the efficiency of the power transfer. Thus, the wireless power receiving efficiency depends on the length-to-distance ratio of the two plates 58 and the orientation of the plates 58 relative to the direction of the electric field. As will be appreciated, maintaining the plates 58 normal to the electric field maximizes the wireless power harvesting efficiency. Furthermore, the orientation and location of the plates 58 relative to the electric field determines the type of electric field coupling. The receiver 14 and transmitter 12 can be strongly, loosely or critically coupled. When the receiver 14 is close to the transmitter 12 and the plates 58 of the receiver 14 are aligned for maximum power transfer at the highest efficiency level, the receiver 14 and transmitter 14 are strongly coupled. When the receiver 14 is farther away from the transmitter 12 and the plates 58 of the receiver 14 are still aligned for maximum power transfer, the receiver 14 and transmitter 12 are loosely coupled. The transmitter 12 and receiver 14 become critically coupled, when the receiver 14 is at a distance from the transmitter 12 where the efficiency level of power harvesting falls below a threshold level and/or when the orientation of the plates 58 relative to the electric filed is such that the efficiency level of power harvesting falls below a threshold level.

Wireless power transmission between the transmitter 12 and the receiver 14 is based upon the resonant frequency of the receiver antenna 54 and the receiver coil 52 being in tune with the resonant frequency of transmitter antenna 16 and the transmitter coil 30. Since the frequency can be affected by the environment in which the volume 20 is located, the receiver AFT circuit 60 tunes the operating frequency of the receiver 14 to the resonant frequency required. The receiver AFT circuit 60 does not have to be continuously active. It need only intermittently adjust the operating frequency of the receiver 14 in response to environmental changes in the volume 20. The receiver 14 must initially power the receiver AFT circuit 60 with the receiver power supply, but once wireless power transfer has commenced, the wirelessly transferred power can be used to power the receiver AFT circuit 60. The resonant frequency is initially known so that the receiver AFT circuit 60 may tune the receiver 14 to this frequency.

Although an exemplary power transmission system has been described above, those of skill in the art will appreciate that many alternative configurations are possible. For example, if desired the resonator 32 may comprise its own power source or supply to supply power to the various components of the transmitter 12.

Although the transmitter coil 30 has been described as being a flat spiral or pancake coil, different transmitter coils may be used. For example, in another embodiment, the transmitter coil 30 is constructed using multiple strand Litz wire. Litz wire provides increased overall efficiency relative to solid copper wire. In this embodiment, the Litz wire is one hundred seventy-six (176) strand forty (40) AWG wire and the resulting transmitter coil 30 has thirty (30) turns with a diameter of approximately ten (10) inches. The operating frequency of the transmitter coil is one (1) MHz and the inductance of the transmitter coil is one hundred fifty (150) uH. Such a transmitter coil 30 has a Q-factor of two hundred (200). In yet another embodiment, the transmitter coil 30 is constructed using multiple strand 48 AWG Litz wire. In this embodiment, the Litz wire is 2700 strand and the resulting transmitter coil 30 has forty-eight (48) turns with a diameter of approximately 15 inches. The operating frequency of the transmitter coil is 1 MHz and the inductance of the transmitter coil is 180 uH. Of course, those of skill in the art will appreciate that variations in the number of turns, gauge, number of strands, wire type are possible so long the as transmitter coil 30 is resonant at the required frequency.

Figure 3C:
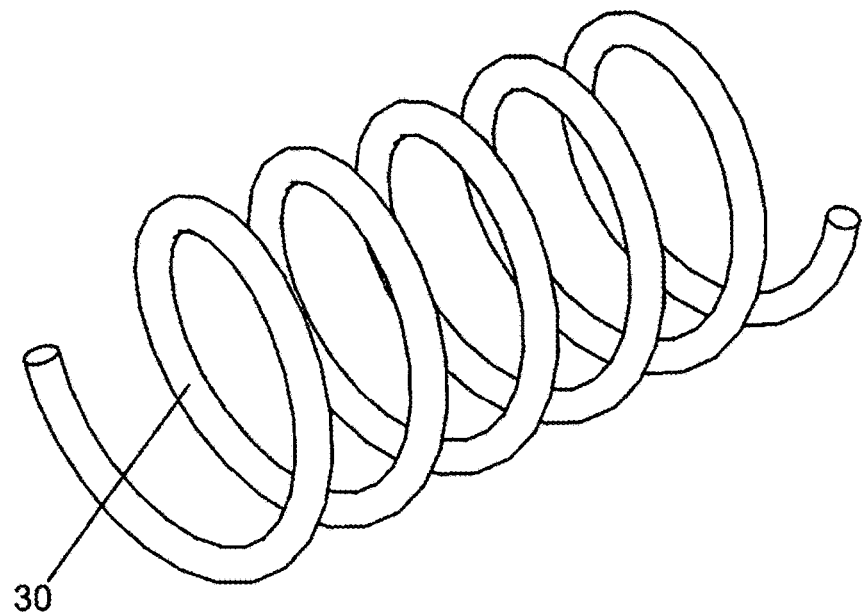

The transmitter coil may also take different shapes. For example, FIG. 3b shows a toroidal transmitter coil 30 and FIG. 3c shows a cylindrical spiral transmitter coil that may be employed instead of the flat spiral or pancake coil.

Figure 13:
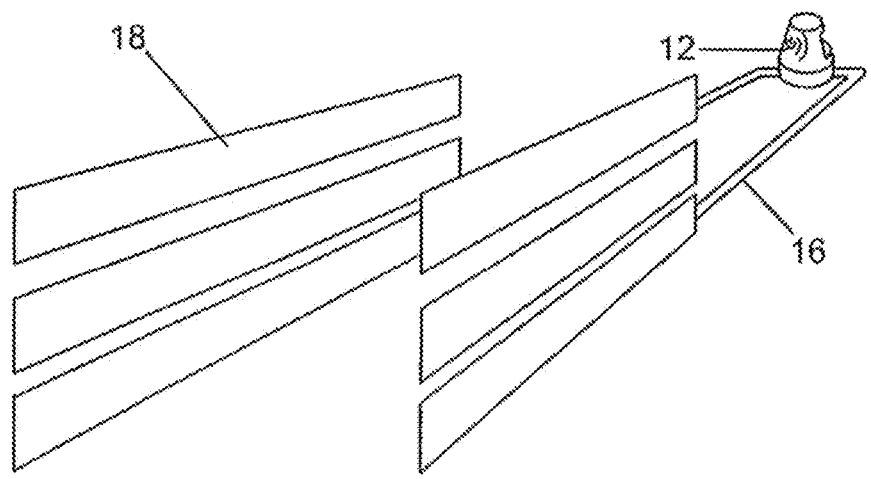
FIG. 13 is a schematic layout view of another embodiment of a transmitter and transmitter antenna for the wireless electric field power transmission system of FIG. 1.
Figure 14:
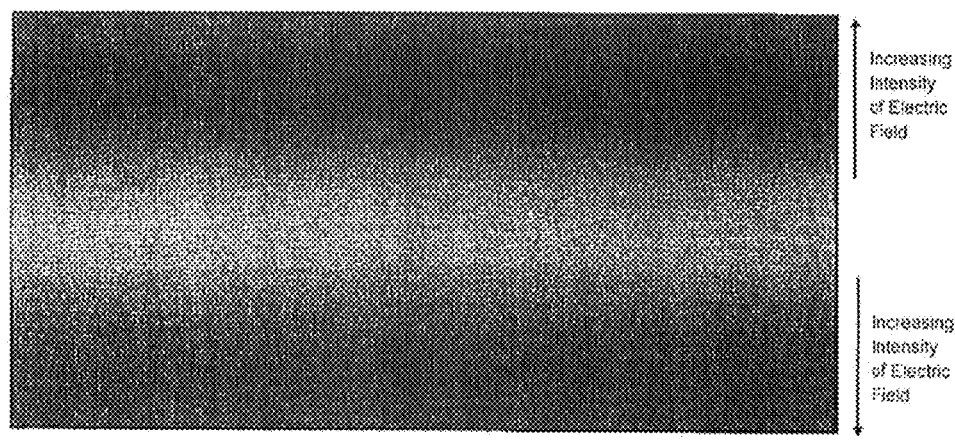
FIG. 14 shows the intensity of an electric field generated by the transmitter and transmitter antenna of FIG. 13.

The number and configuration of the conductors 18 of the transmitter antenna 16 may also be varied. For example, FIG. 13 shows a transmitter antenna 16 with six conductors 18, three (3) conductors of which are positioned on each side of the volume. In this embodiment, the capacitive reactance is reduced, compared to using two conductors 18. Similar to the previous embodiment, the six conductors 18 are made of aluminum foil tape. The distribution of the electric field that is emitted by the transmitter antenna becomes more uniform due to the increase in the overall surface area of the conductors 18. The electric field intensity decreases near the sides and increase towards the middle of the volume 20 as shown in FIG. 14 resulting in a more evenly distributed field. In this embodiment, the conductors 18 of the transmitter antenna 16 are placed five (5) meters apart, however the separation distance can be varied based on the application. For example, the conductors 18 may be installed in different room sizes, such that the separation distance varies. In yet another embodiment, the transmitter antenna 16 may comprise a single conductor 18.

The conductor material has been found to have little effect on performance and as a result other conductive materials for the conductors may be used. For example, the conductors 18 may be formed of copper tape or other suitable conductive material. The conductors 18 may also be covered with a decoration for aesthetic purposes.

Although a particular implementation of the resonator circuitry has been shown, this may also vary. For example, the delay line 41 may be implemented using passive LC networks or transmission lines. A non-ferrite core balun or other suitable decoupling structure may be employed.

While a particular receiver 14 configuration has been described, other configurations are possible. For example, the plates 58 of the receiver antenna 54 need not be accommodated by the receiver case 56, but rather may be external to the receiver case 56.

Furthermore, the receiver coil 52 used may also vary. For example, the receiver coil 52 may be constructed of Litz wire. In one such embodiment, the Litz wire is forty (40) AWG, 3 strand Litz wire. The resulting receiver coil 52 has over three-hundred (300) turns and a Q-factor of sixty (60). The operating frequency of the receiver coil is one (1) to two (2) MHz and the inductance of the receiver coil is three (3) mH. The diameter of the receiver coil 52 is approximately four (4) inches (twelve (12) cm). The receiver coil 58 is positioned between the two plates 58 and in this orientation the magnetic field created by the receiver coil 52 creates lossy circular currents in the plates 58 which will therefore dissipate a small amount of available power at the receiver 14. In another embodiment, the wire (Litz wire or insulated solid copper wire) used to make the receiver coil 52 may be wound about a non-conducting material to ensure consistency of the turns of the receiver coil 52. In another embodiment, Litz wire that is forty-eight (48) AWG, fifty (50) strand Litz wire is used for the receiver coil 52. The number of turns is over three hundred (300), the frequency is one (1) MHz and the inductance is three (3) mH. The diameter of the receiver coil 52 is still four (4) inches (twelve (12) cm). In another embodiment, Litz wire that is forty-eight (48) AWG, six hundred seventy-five (675) strand Litz wire is used for the receiver coil. The number of turns is over seventy-five (75), the frequency is two (2) MHz and the inductance is seven hundred fifty (750) uH. The diameter of the receiver coil 52 is still four (4) inches (twelve (12) cm). Of course, those of skill in the art will appreciate that variations in the number of turns, gauge, number of strands, wire type are possible so long the as receiver coil 52 is resonant at the required frequency.

Figure 15:
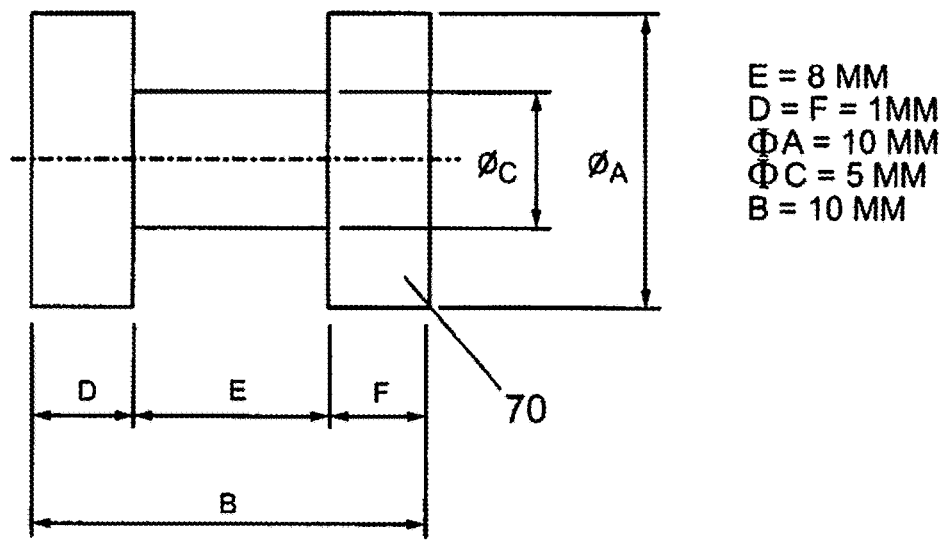
FIG. 15 is a schematic layout view of ferrite core inductors.

In another embodiment, the receiver coil 52 is replaced with ferrite-core inductors 70 as illustrated in FIG. 15. The inductors 70 are ten (10) millimeters long each and thus, smaller than the receiver coil 52. The Q-factor for the set of small inductors 70 is sixty (60) and the frequency is two (2) MHz. The inductors 70 are designed to work at higher frequencies, have a high quality factor and a high value of inductance, greater than fifty (50) uH.

Figure 11B:
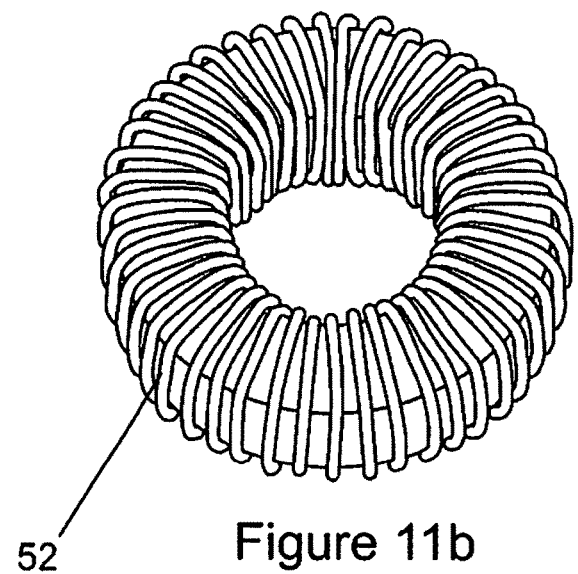
Figure 11C:
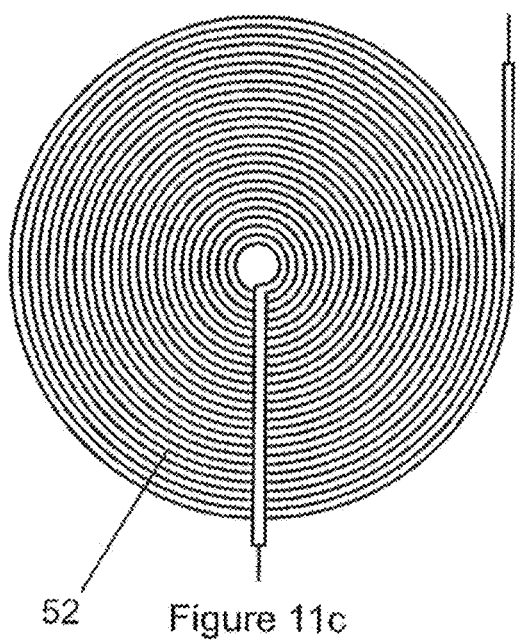

The shape of the receiver coil may also be varied. For example, FIG. 11b shows a toroidal receiver coil 52 and FIG. 11c shows a flat spiral receiver coil.

Figure 16:
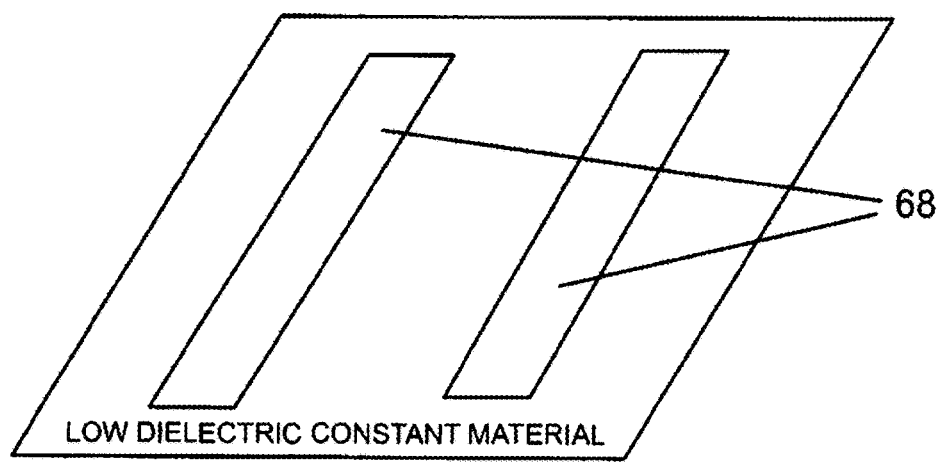
FIG. 16 is a schematic layout view of another embodiment of a receiver antenna.

In another embodiment, the receiver antenna 54 comprises rails 68 instead of plates 58. The rails 68 are attached to a substance with a low dielectric constant and positioned in the same plane as illustrated in FIG. 16. Thus, the receiver antenna 54 can be entirely flat allowing for easy incorporation into devices. The rails 68 need not be precisely parallel to one and other.

While a particular configuration has been presented for the DC-DC voltage converter 66, other configurations are possible. For example, two or more DC-DC voltage converters 66 arranged in parallel may be employed to down-convert the DC voltage output by the rectifier to useable levels. Alternatively, two or more DC-DC voltage converters 66 arranged in series may be employed to down-convert the DC voltage output by the rectifier to useable levels. For example, a first DC-DC converter may be employed to convert the DC voltage output by the rectifier from one thousand (1000) V to one hundred (100) V then a second DC-DC converter 66 may be employed to convert the DC voltage output by the first DC-DC converter from one hundred (100) V to five (5) V. The overall efficiency of the entire down-conversion will be the product of all the blocks connected in series which is lower than just one of the converters 66.

Figure 17:
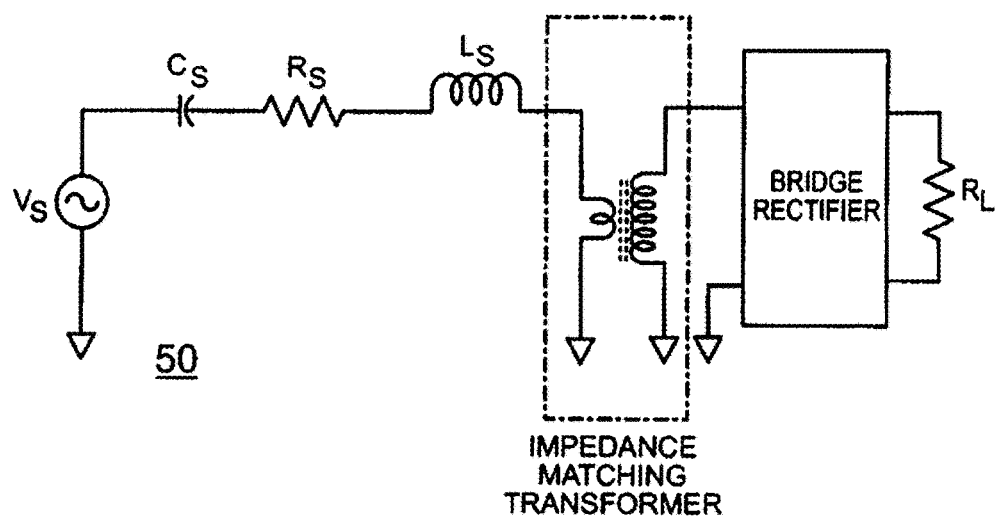
FIG. 17 is a circuit diagram of components of an alternative receiver.

Furthermore, while particular power harvesting circuitry has been described with reference to FIG. 9, other configurations are possible. For example, in another embodiment, the circuitry of FIG. 9 has a series configuration. As shown in FIG. 17, the device is connected to the bridge rectifier 64 in series. The device is modeled by an inductor $L_s$, capacitor $C_s$ and resister $R_s$ which are connected in series which results in lower output AC voltages and higher currents compared to the parallel configuration. A balun is placed between the $L_sC_s$ series resonant circuit and bridge rectifier 64 to provide impedance matching.

In another embodiment, the impedance is matched in the receiver 14 using lumped element matching.

Figure 18A:
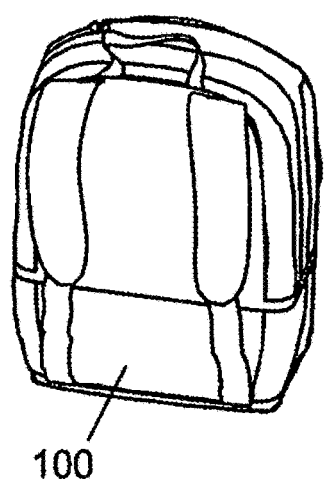
FIGS. 18a and 18b are perspective views of a backpack equipped with a receiver and receiver antenna.
Figure 18B:
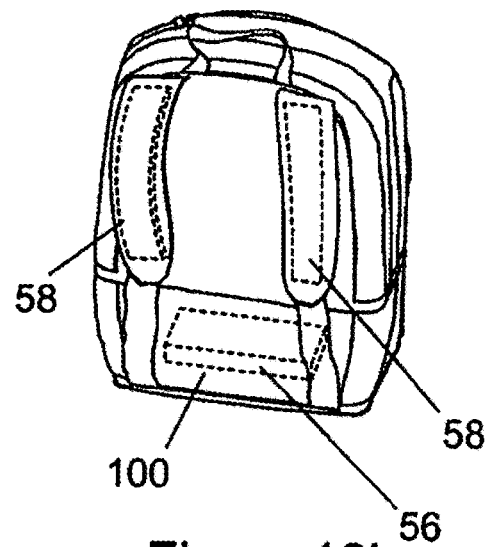

The power transmission system may be employed in a variety of diverse applications to allow power to be wirelessly transmitted from the transmitter to the receiver via electric field coupling. For example, in one application the receiver 14 is positioned within a backpack 100 as shown in FIGS. 18a and 18b. The plates 58 are integrated into the backpack 100 on opposite sides thereof. The plates 58 are connected to the receiver case 56 and the components within the receiver case 56. The receiver case 56 is then further connected (not shown) to a recharger that recharges traditional batteries such as AA, 9V batteries or other non-traditional or custom rechargeable battery formats. The backpack 100 may be used in military applications where soldiers require batteries for a variety of equipment, such as night-vision goggles. Recharging batteries reduces the need for backup batteries to be carried by the soldiers thereby reducing the already significant weight of backpacks 100 used in the military. The backpack 100 may further comprise a battery (not shown) connected to the receiver 14 that charges when no batteries are present in the recharger.

The transmitter 12 and transmitting antenna 16 may be integrated into a vehicle 102 as illustrated in FIGS. 19a and 19b. In this example, the conductors 18 of the transmitter antenna 16 are integrated into the interior walls of the vehicle 102 and hidden and are connected to the transmitter 12. The conductors 18 are positioned such that they are approximately parallel to each other. When backpacks 100 are placed in the vehicle 102 and within the volume between the conductors, the receivers 14 are able to harvest power in the manner described above.

Figure 21A:
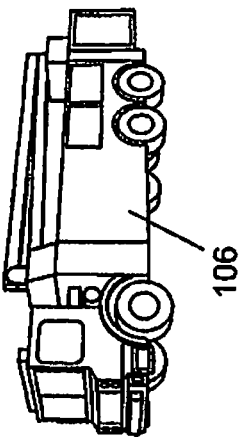
FIGS. 21a and 21b are perspective views of a fire truck equipped with a transmitter and transmitter antenna.
Figure 21B:
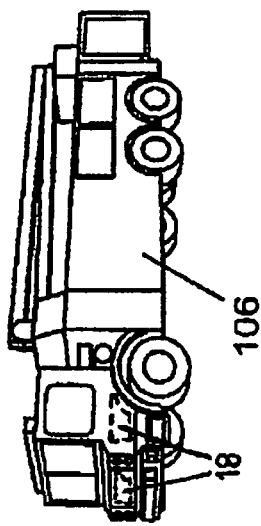

In another application, the receiver 14 is integrated into a radio communication device 104 such as those used by firefighters, police officers or other individuals. As will be appreciated, in instances the radio communication devices 104 may not be fully charged either due to neglect or insufficient preparation time before an emergency situation. In this case, the rails 68 of the receiver 14 are affixed to the backside of the radio communication device 104 as shown in FIGS. 20a and 20b. The transmitter 12 and transmitter antenna may be integrated into the front cabin of a fire truck or other vehicle 106 as shown in FIGS. 21a and 21b. Thus, when radio communication devices are placed inside the front cabin of the fire truck 106 and within the volume between the conductors 18 of the transmitter antenna, the radio communication devices are charged. In another embodiment, the transmitter and transmitter antenna are placed at a particular location within a fire station.

Figure 22A:
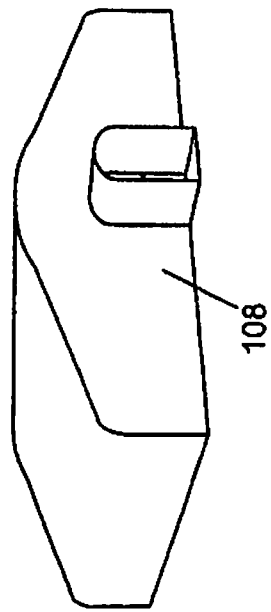
FIGS. 22a and 22b are perspective views of a tent equipped with a transmitter and transmitter antenna.
Figure 22B:
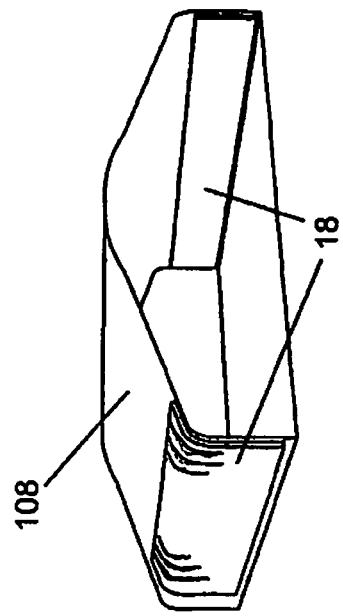

In another application, the power transmission system 10 may be employed in a military base camp. When military officers set up a base camp most of the electronic equipment is stored in a few select tents 108 or barracks as shown in FIGS. 22a and 22b. This is in part due to the fact that not every location is equipped with electricity to power the electronic equipment. In this embodiment, the conductors 18 of the transmitter antenna 12 are integrated into the interior walls of the tent 108 and provide wireless power to all devices within the tent 108 which are equipped with a receiver 14. Tables that support the devices, are positioned near the tent 108 interior walls, thus near the conductors 18, ensuring maximum power transfer efficiency. The devices can therefore be charged without requiring physical corded connections reducing the large number of hazardous wires and power cables.

Figure 23B:
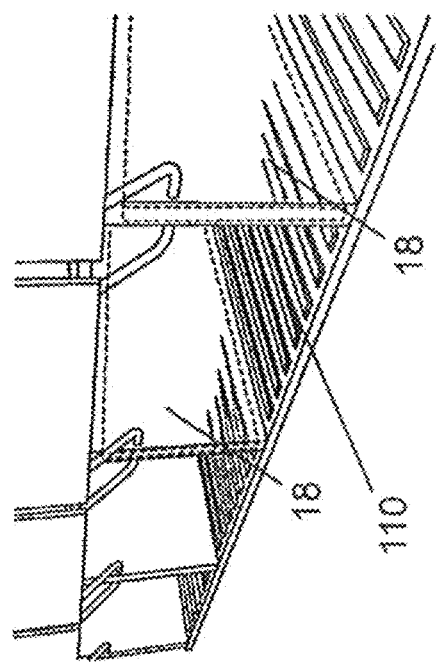
FIGS. 23a and 23b are perspective views of a bus cargo interior equipped with a transmitter and transmitter antenna.
Figure 23A:
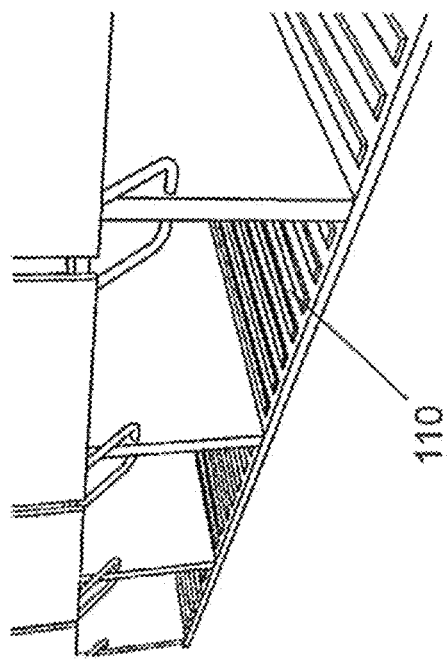

In another application, the transmitter 12 and transmitter antenna are integrated into the interior of a bus cargo area 110 as illustrated in FIGS. 23a and 23b. The conductors 18 are integrated into opposite walls of the interior of the bus cargo area 110 and transmit power wirelessly to backpacks 100, or other devices equipped with receivers 14, when they are placed within the cargo area 110.

Figure 24B:
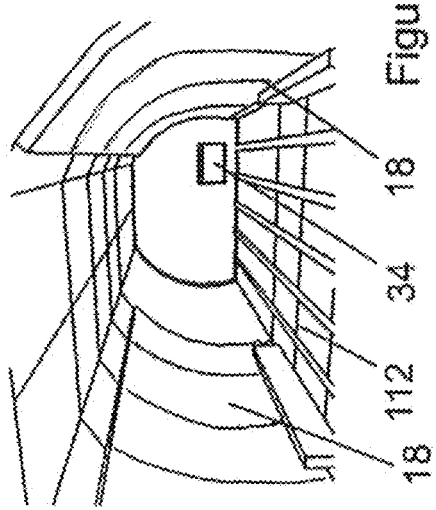
FIGS. 24a and 24b are perspective views of an airplane interior equipped with a transmitter and transmitter antenna.
Figure 24A:
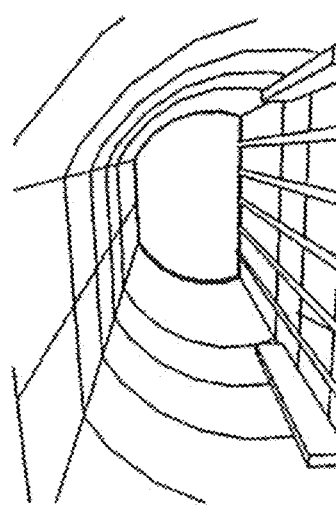

In another application, the transmitter 12 and the transmitter antenna 16 are integrated into the interior of an airplane 112 as illustrated in FIGS. 24a and 24b. The conductors 18 of the antenna 16 are integrated into the interior walls of the airplane 112. Backpacks 100 or other devices equipped with receiver power wirelessly when situated within the plane 112 interior.

Figure 25B:
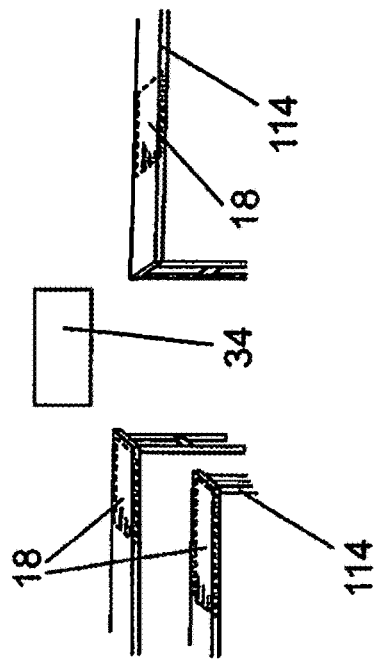
FIGS. 25a and 25b are perspective views of a table equipped with a transmitter and transmitter antenna.
Figure 25A:
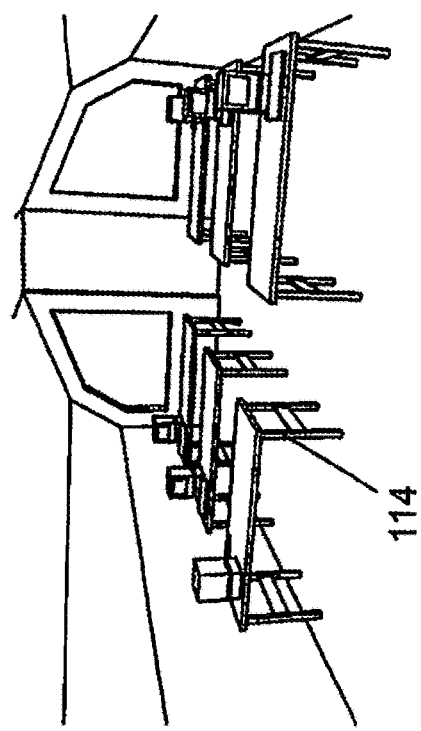

In another application the transmitter 12 and transmitter antenna 16 are integrated into a table 114 as illustrated in FIGS. 25a and 25b. The conductors 18 are flat on the table 114 and connected to the transmitter coil 30 as already explained. The receiver 14 is situated on, above or between the conductors 18 to receive power wirelessly.

Figure 26A:
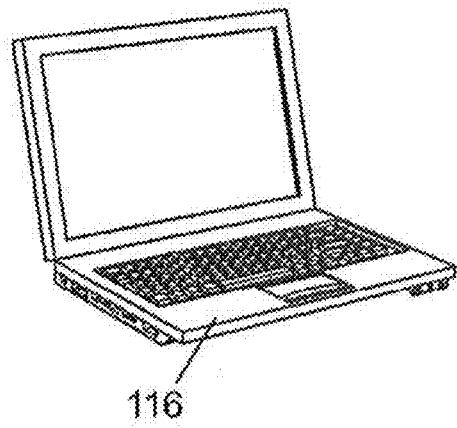
FIGS. 26a, 26b, 26c and 26d are perspective views of a laptop computer equipped with a receiver and receiver antenna.
Figure 26B:
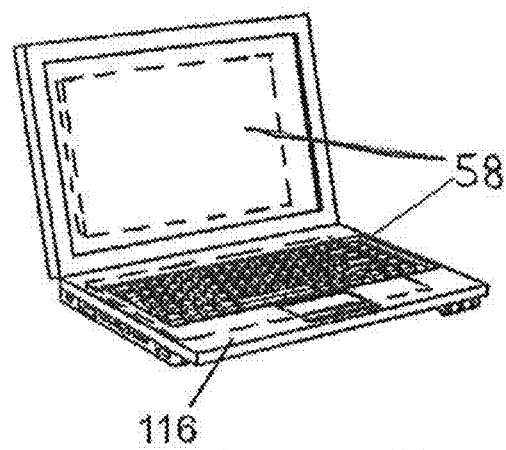

In another application the plates 58 of the receiver 14 are affixed to a laptop computer 116 as illustrated in FIGS. 26a and 26b. One plate 58 is flat and affixed to the laptop computer 116 behind the display screen, while the other plate 58 is flat and affixed below the keyboard on the bottom of the laptop computer 116. The received wireless power can be transferred to the battery of the laptop computer 116.

Figure 26C:
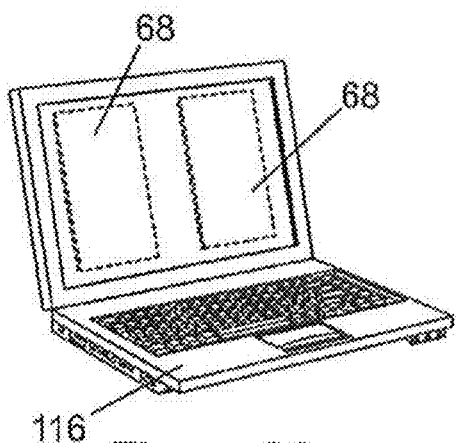
Figure 26D:
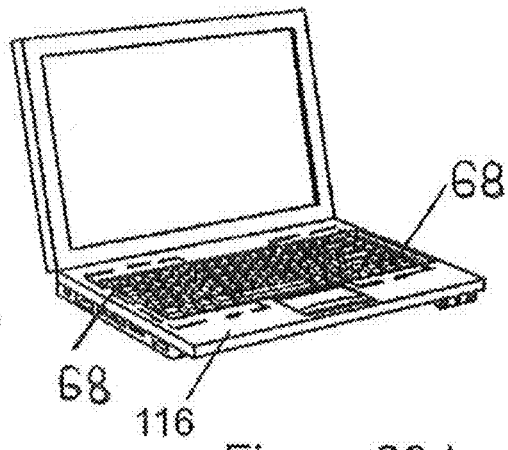

In another application the rails 68 of the receiver 14 are in the same plane, both on the back of the screen or both on the bottom of the laptop computer 116 as illustrated in FIGS. 26c and 26d. This configuration is well suited to receive power from the table 114 equipped with a transmitter 12 as already described.

Figure 27B:
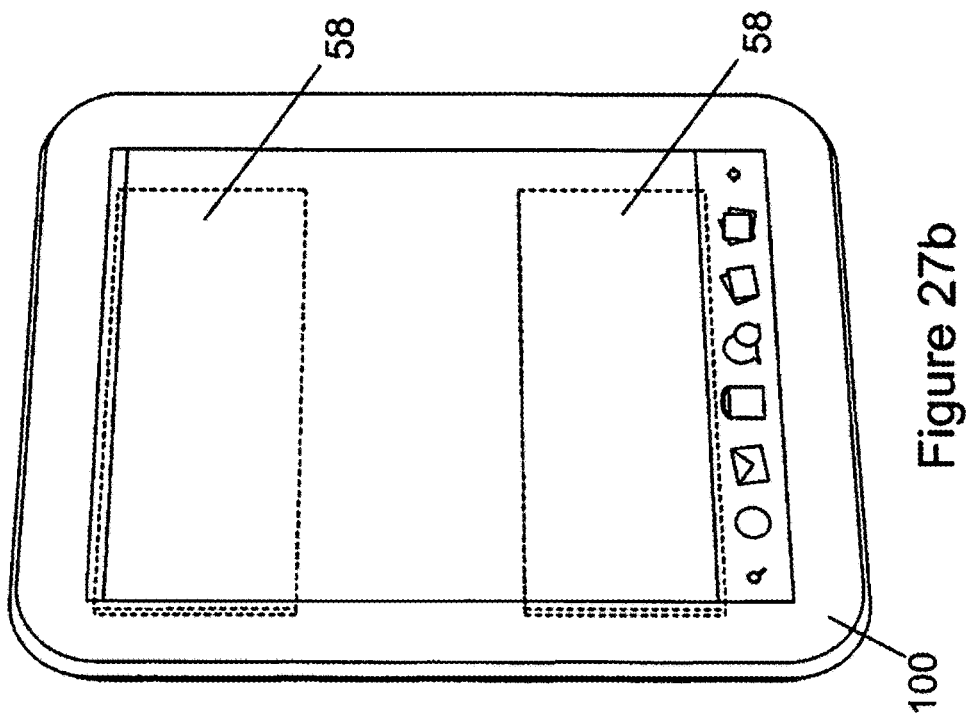
FIGS. 27a and 27b are perspective views of a tablet computer equipped with a receiver and receiver antenna.
Figure 27A:
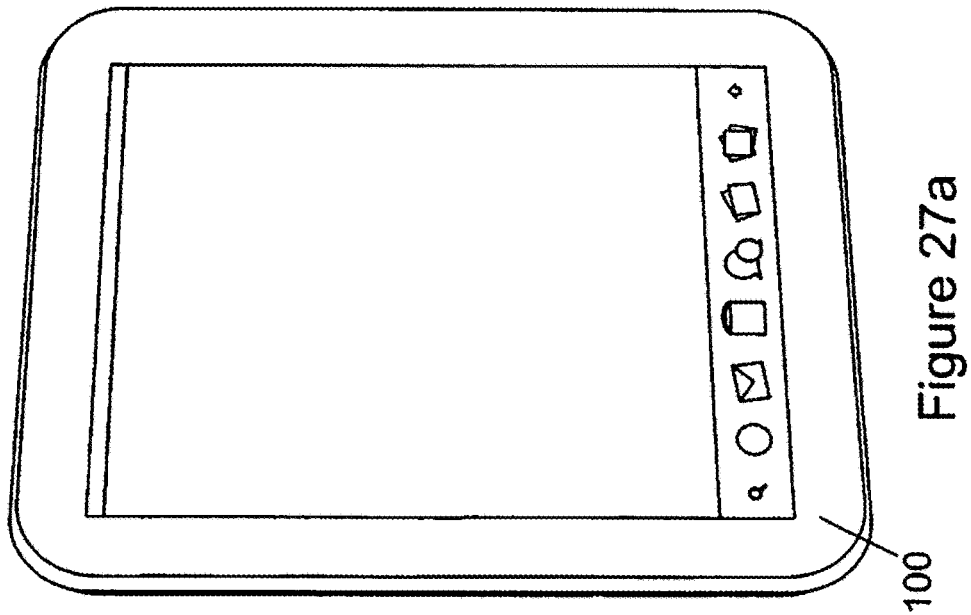

In another application the plates 58 of the receiver 14 are mounted some distance away from each other on the backside of the screen of a tablet computer 118 similar to the mounting on the back of a laptop screen already described as illustrated in FIGS. 27a and 27b.

Figure 28B:
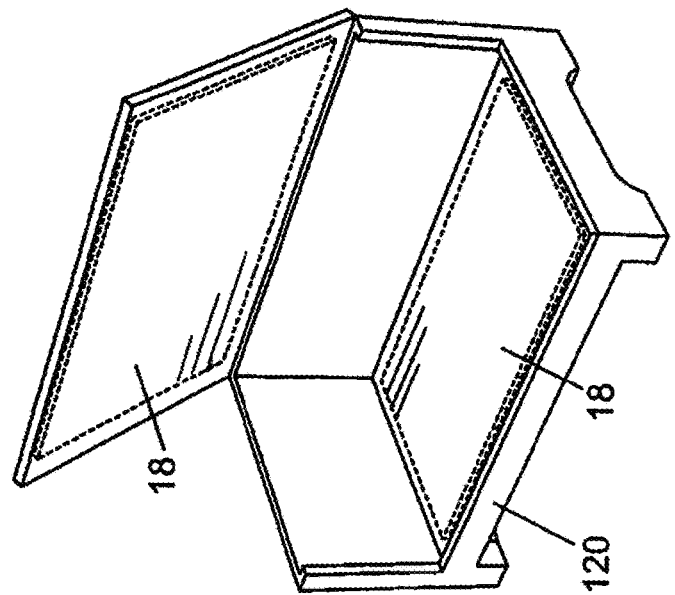
FIGS. 28a and 28b are perspective views of a container equipped with a transmitter and transmitter antenna.
Figure 28A:
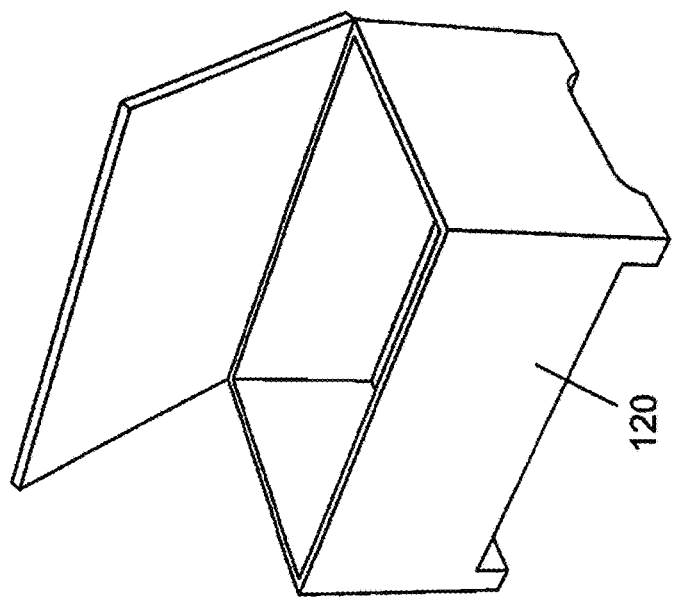

In another application the transmitter 12 and transmitter antenna are integrated into an enclosed container 120, which may have one or more removable or hinged panels to allow for receiver 14 devices to be placed inside as illustrated in FIGS. 28a and 28b. When receivers 14 are inside the container 120, they can receive wireless power transmitted from the transmitter 12. The container 120 may be constructed such that it is shielded to prevent any leakage of the electromagnetic field (EMF) or other signals or fields from the inside of the container 120 to the outside. When the panels or lid of the container 120 is closed, the transmitter 12 is made aware via a signal that the signal or field strength inside the container 120 can be increased without risk of exposure to humans or animals, thereby allowing greater amounts of power and higher rates of power transfer efficiency to be achieved. This allows for faster rates of battery recharging from receivers 14 inside the container 120 when it is closed or sealed.

Figure 29A:
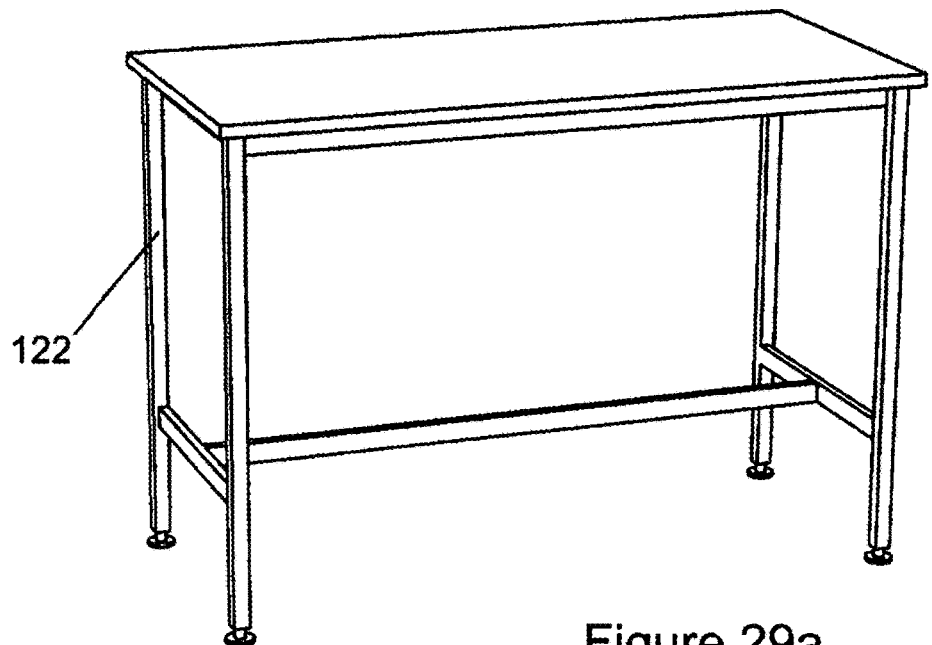
FIGS. 29a and 29b are perspective views of a tabletop equipped with a transmitter and transmitter antenna.
Figure 29B:
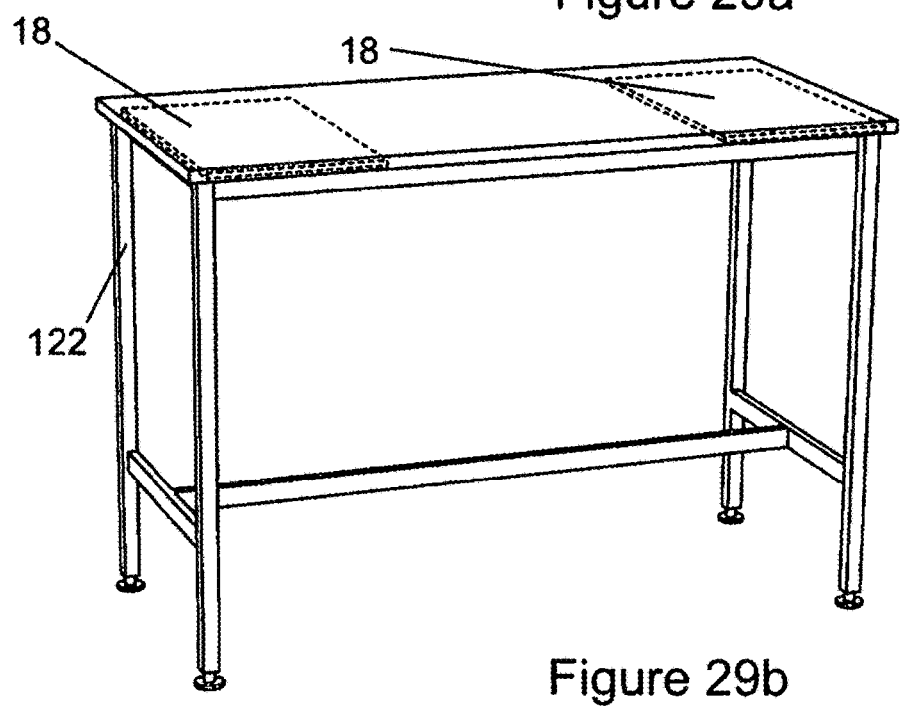

In another application the transmitter 12 and transmitter antenna 16 are integrated into, laid upon or otherwise affixed to a flat surface upon which receiver 14 devices may be laid or hung. This can include, but is not limited to, tables, desks, counters, shelves, walls, floors, ceilings, and doors. Integration of the conductors 18 of the transmitter 12 into a tabletop 122 is illustrated in FIGS. 29a and 29b.

Figure 30A:
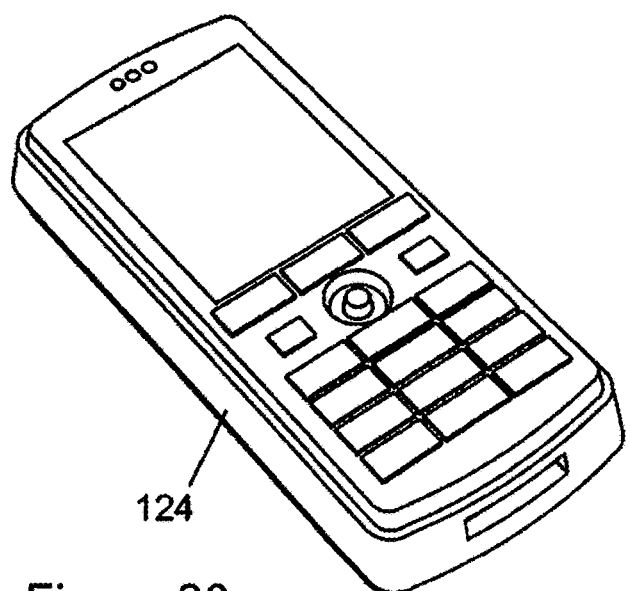
FIGS. 30a and 30b are perspective views of a cellular phone equipped with a receiver and receiver antenna.
Figure 30B:
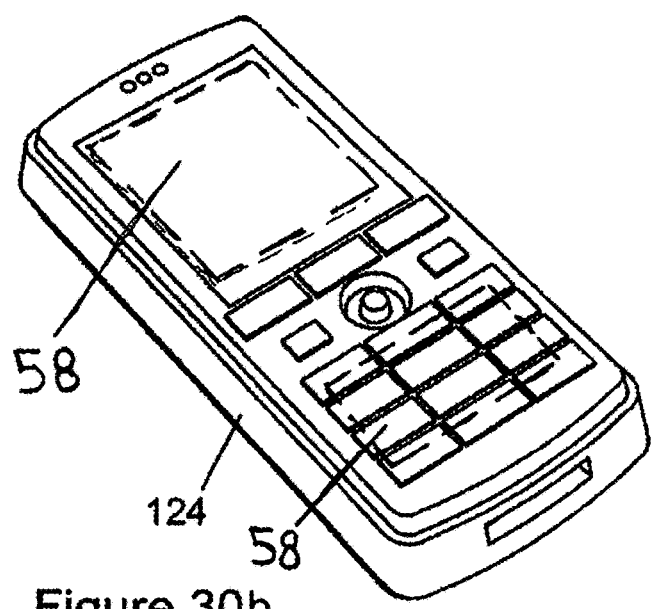

In another application the plates 58 of the receiver 14 are integrated into or are otherwise affixed to a cordless, mobile or cellular phone 124 as illustrated in FIGS. 30a and 30b.

Figure 31A:
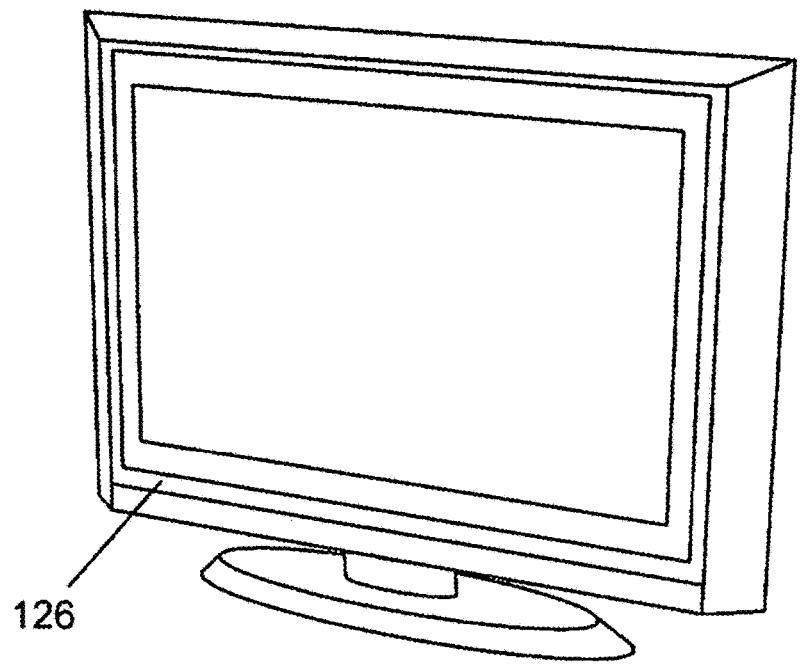
FIGS. 31a and 31b are perspective views of a television set equipped with a receiver and receiver antenna.
Figure 31B:
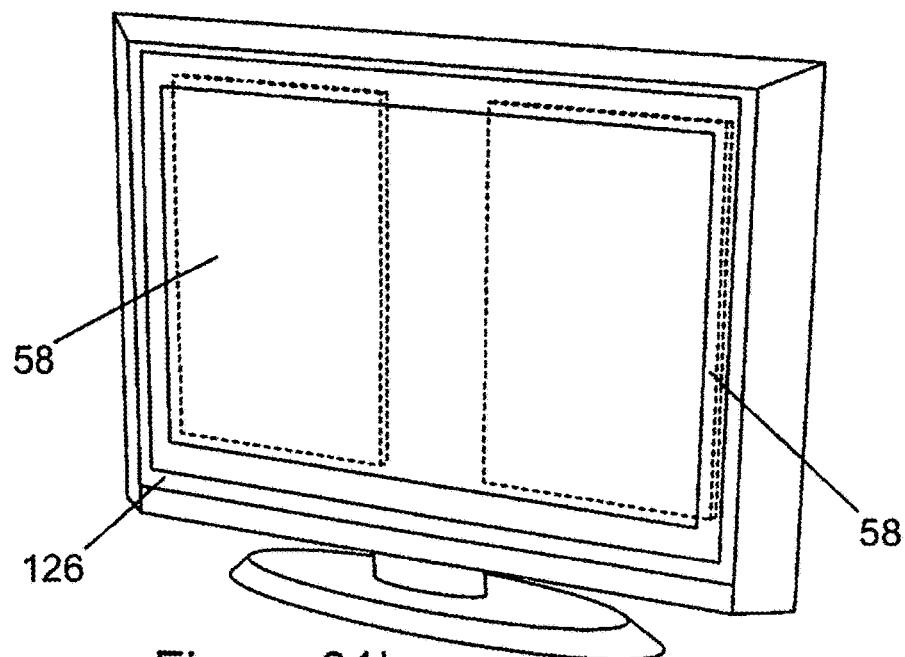

In another application the plates 58 of the receiver 14 are integrated into or are otherwise affixed to a television set 126, whether the television is Plasma, LCD, LED, OLED or of some other technology as illustrated in FIGS. 31a and 31b.

In another application the plates 58 of the receiver 14 are integrated into or are otherwise affixed to a home electronics devices including, but not limited to, DVD players, Blu-ray players, receivers, amplifiers, all-in-one home theatre, speakers, sub-woofers, video game consoles, video game controllers, remote control devices, televisions, computers or other monitors, digital cameras, video cameras, digital photo frames, video or image projectors or media streaming devices.

In another application the plates 58 of the receiver 14 are integrated into or are otherwise affixed to rechargeable batteries 128 such that the battery becomes a receiver device as illustrated in FIGS. 32a and 32b.

Figure 33A:
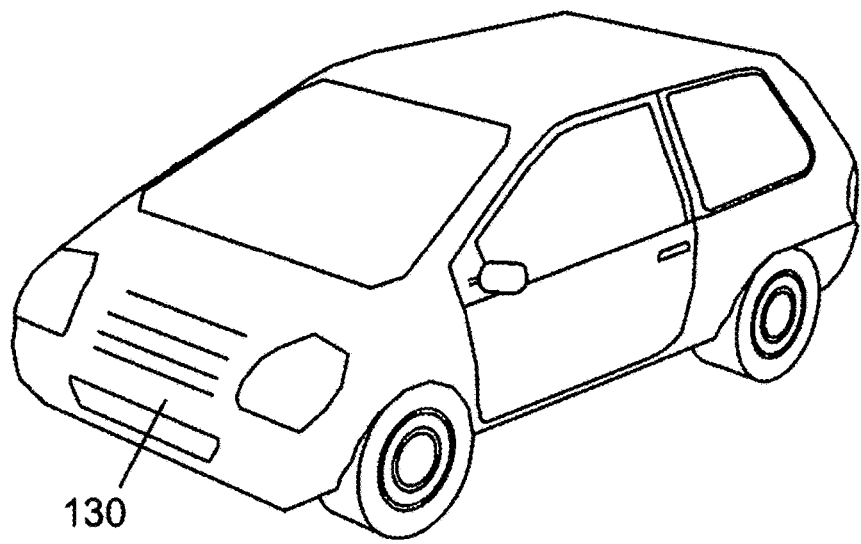
FIGS. 33a and 33b are perspective views of a vehicle equipped with a receiver and receiver antenna.
Figure 33B:
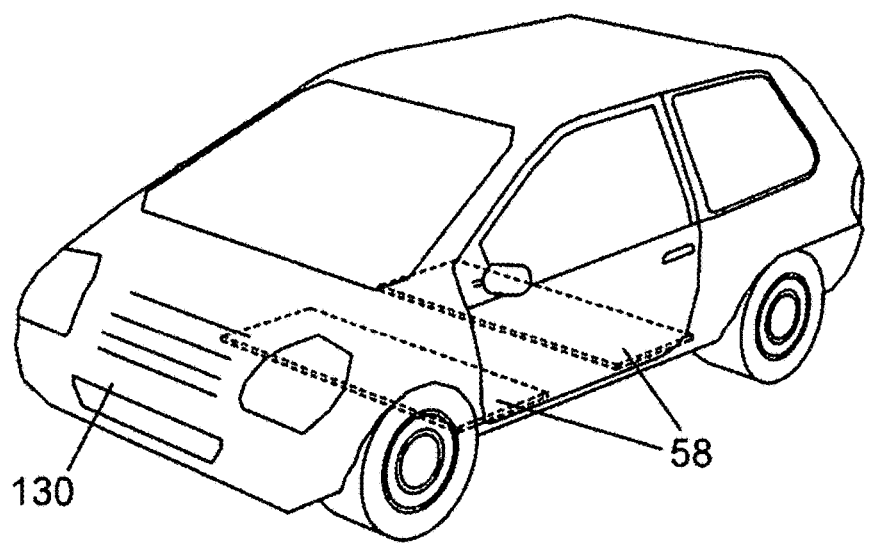

In another application the plates 58 of the receiver 14 are integrated into or are otherwise affixed to an electric or hybrid motorized vehicle 130. In this embodiment the plates 58 are located on the bottom of the vehicle 130 for receiving wireless power from a transmitter 12 placed below the vehicle 130 as illustrated in FIGS. 33a and 33b. The transmitter 12 and transmitter antenna 16 may be placed in a mat under the vehicle 130, or embedded in or below the road or driveway under the vehicle 130.

Figure 34A:
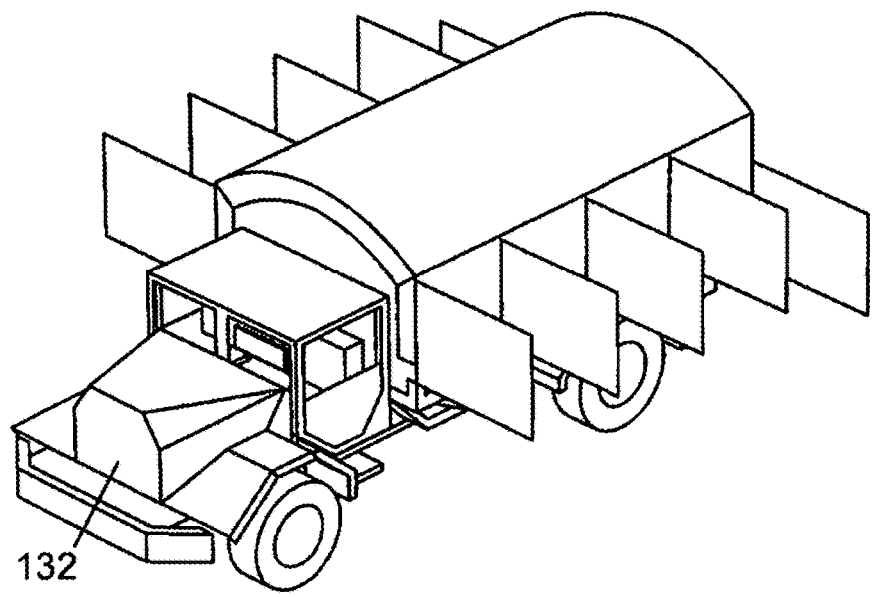
FIGS. 34a and 34b are perspective views of a military vehicle equipped with a transmitter and transmitter antenna.
Figure 34B:
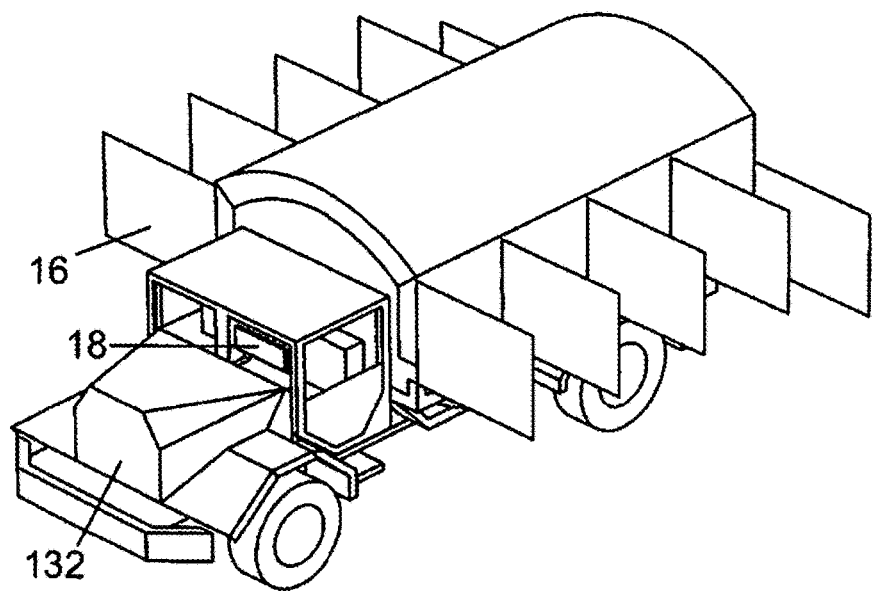

In another application the transmitter 12 and transmitter antenna 16 are integrated into fold-out flaps or barriers that are attached to a military vehicle 132, walls, or doors as illustrated in FIGS. 34a and 34b. When such flaps are extended from the structure or device onto which they are mounted, they create a volume 20 within which receivers 14 may be placed for wireless power transfer. The flaps may incorporate hooks, shelves or other such devices for holding or otherwise mounting structures including receivers 14, such as backpacks.

Figure 35A:
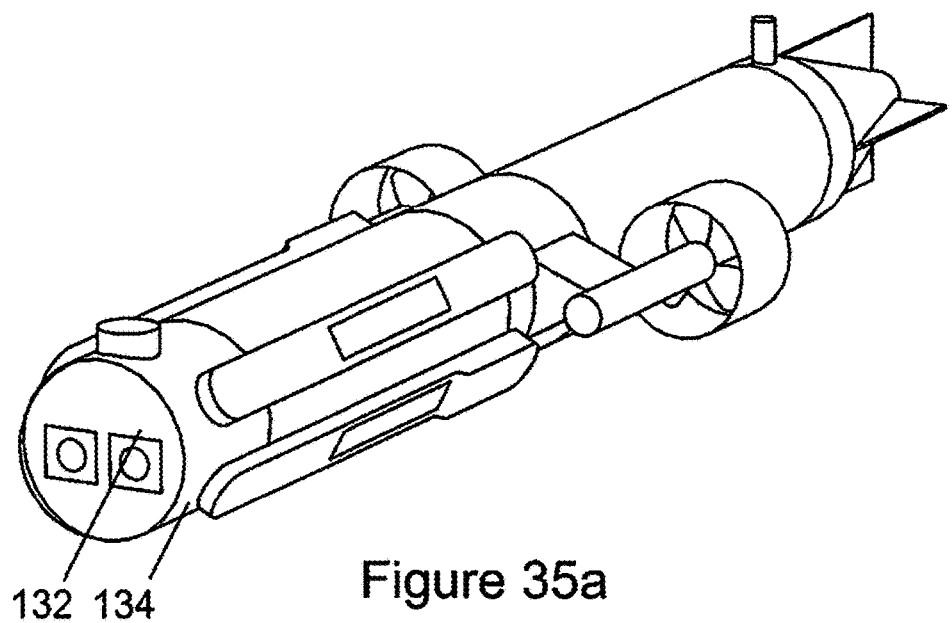
FIGS. 35a and 35b are perspective views of an Unmanned Autonomous Vehicle (UAV) equipped with a receiver and receiver antenna.
Figure 35B:
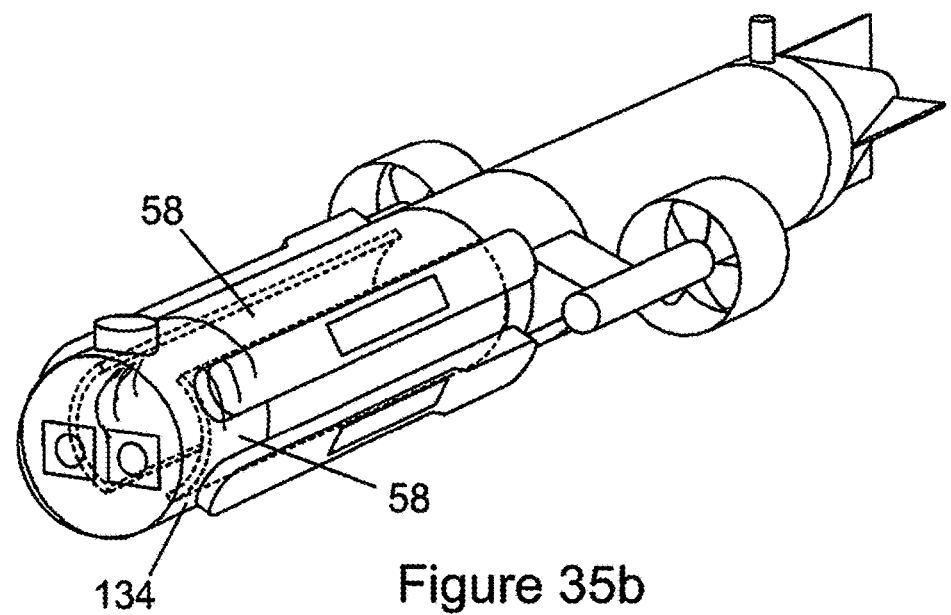

In another application the plates 58 of the receiver 14 are integrated into or are otherwise affixed to an Unmanned Autonomous Vehicles (UAVs) 134 or other such vehicles or devices, such that wireless power may be delivered to the UAV and its onboard power system and/or power storage device as illustrated in FIGS. 35a and 35b.

In another application the transmitter 12 and transmitter antenna 16 are integrated into a device that may be located in a public space or common area, whereby one or more people may enter the transmission volume 20 and receive wireless power with their own device comprising at least one receiver 14. These publicly available zones for wireless power transmission may be referred to as HotSpots, as they are for publicly available wireless internet access zones.

In another application the transmitter 12 and transmitter antenna 16 are integrated into a device that may be used to create a HotSpot as described in the previous paragraph, the HotSpot may be mobile for particular applications such as, but not limited to, military missions in which a group of soldiers carry a portable power generating source or a portable power storage source with the transmitter 12 and transmitter antenna 16 integrated into or otherwise connected to the source.

In another application the transmitter 12 and transmitter antenna 16 are integrated into a device that may be used to create a HotSpot, which may also be mobile. The device also has the receiver 14 and plates 58 incorporated into it, effectively making the device a power transceiver for both sending and receiving wireless power.

In another application, any of the previously described receiver devices may be a wireless power transceiver. That is, it may be capable of both receiving and transmitting wireless power.

Although embodiments have been described above with reference to the figures, those of skill in the art will appreciate that variations and modifications may be made without departing from the scope thereof as defined by the appended claims.

What is claimed is:

1. A wireless electric field power transmission system for powering a load, the system comprising:
   a transmitter including a transmitter antenna and a single high quality factor (Q-factor) coil separate from the transmitter antenna, the transmitter antenna including at least two elongate conductive plates defining a volume, the at least two elongate conductive plates configured to resonate with the coil to generate a resonant reactive near electric field in the volume, wherein each plate of the transmitter antenna has the shape of a rectangle having one inner short side, one outer short side, one inner long side and one outer long side, and wherein the at least two elongate conductive plates of the transmitter antenna are approximately parallel along either their outer long sides or their inner long sides; and at least one receiver electrically connectable to the load including a receiver antenna including at least two elongate conductive plates, wherein each plate of the receiver antenna has the shape of a rectangle having one inner short side, one outer short side, one inner long side and one outer long side, wherein the at least two elongate conductive plates of the receiver antenna are approximately parallel along either their outer long sides or their inner long sides, wherein the transmitter antenna is configured to transfer power wirelessly to the at least one receiver via a resonant reactive near electric field coupling when the at least one receiver is within the volume, and wherein a length of each of the at least two elongate conductive plates of the transmitter antenna and a frequency of the system are selected such that a majority of power transferred to the at least one receiver is from an electric field component of an electromagnetic field as in a capacitive coupling wireless power transfer scheme.

2. The system of claim 1, wherein the at least one receiver comprises a high Q-factor receiver coil connected to the receiver antenna, wherein the receiver coil is separate from the receiver antenna and wherein the receiver antenna and the receiver coil resonate at the frequency.

3. The system of claim 1, wherein the elongate conductive plates of the transmitter and receiver antennas are approximately parallel along either their outer long sides or their inner long sides.

4. A method for wirelessly transmitting power, the method comprising:
   providing a transmitter antenna and a single high quality factor (Q-factor) coil separate from the transmitter antenna, the transmitter antenna including at least two elongate conductive plates defining a volume, wherein each plate of the transmitter antenna has the shape of a rectangle having one inner short side, one outer short side, one inner long side and one outer long side, and wherein the at least two elongate conductive plates of the transmitter antenna are approximately parallel along either their outer long sides or their inner long sides;
   resonating the coil and the at least two elongate conductive plates at a transmitter resonant frequency;
   generating, via high Q-factor resonance, a resonant reactive near electric field in the volume;
   positioning a receiver antenna including at least two receiver elongate conductive plates in the volume, wherein each plate of the receiver antenna has the shape of a rectangle having one inner short side, one outer short side, one inner long side and one outer long side, and wherein the at least two receiver elongate conductive plates are approximately parallel along either their outer long sides or their inner long sides; and
   resonating the receiver antenna at the transmitter resonant frequency and thereby transferring power from the transmitter antenna to the receiver antenna for powering a load, wherein a length of each of the at least two elongate conductive plates of the transmitter antenna and the transmitter resonant frequency are selected such that a majority of power received by the receiver antenna is from an electric field component of an electromagnetic field as in a capacitive coupling wireless power transfer scheme.

5. The method of claim 4, wherein resonating the receiver antenna further comprises resonating a high Q-factor receiver coil connected to the receiver antenna at the transmitter resonant frequency, wherein the receiver coil is separate from the receiver antenna.

6. A method for wirelessly transferring power, the method comprising:
   providing a transmitter antenna and a single high quality factor (Q-factor) coil separate from the transmitter antenna, the antenna including at least two elongate conductive plates defining a volume, wherein each plate of the transmitter antenna has the shape of a rectangle having one inner short side, one outer short side, one inner long side and one outer long side, and wherein the at least two elongate conductive plates of the transmitter antenna are approximately parallel along either their outer long sides or their inner long sides;
   resonating the at least two elongate conductive plates and the coil at a start-up frequency;
   tuning the conductive plates and the transmitter coil to their resonant frequency;
   generating a resonant reactive near electric field within a volume defined by the at least two elongate conductive plates;
   placing a receiver with a receiver antenna including at least two receiver elongate conductive plates in the volume, wherein each plate of the receiver antenna has the shape of a rectangle having one inner short side, one outer short side, one inner long side and one outer long side, and wherein the at least two receiver elongate conductive plates are approximately parallel along either their outer long sides or their inner long sides;
   accumulating a potential difference on the two receiver elongate conductive plates;
   resonating the receiver antenna at the resonant frequency; and
   gathering power for powering a load from the receiver antenna, wherein a length of each of the at least two elongate conductive plates of the transmitter antenna and the resonant frequency are selected such that a majority of power gathered by the receiver antenna is from an electric field component of an electromagnetic field as in a capacitive coupling wireless power transfer scheme.

7. The method of claim 6, wherein the receiver further comprises a high Q-factor receiver coil connected to the receiver antenna, wherein the receiver coil is separate from the receiver antenna and wherein resonating the receiver antenna further comprises resonating the receiver coil at the resonant frequency.

8. A transmitter for wirelessly transmitting power, the transmitter comprising:
   a transmitter antenna configured to create a resonant reactive near electric field, the antenna including at least two elongate conductive plates defining a volume, wherein each plate of the transmitter antenna has the shape of a rectangle having one inner short side, one outer short side, one inner long side and one outer long side, and wherein the at least two elongate conductive plates of the transmitter antenna are approximately parallel along either their outer long sides or their inner long sides;
   a single high quality factor (Q-factor) coil configured to be connected to the transmitter antenna, the coil being separate from the transmitter antenna; and
   a resonator configured to be connected to the coil for resonating the coil and the at least two elongate conductive plates at a resonant frequency to transfer power for powering a load via resonant reactive near electric field coupling to a receiver antenna including at least two elongate conductive plates, the resonator including an auto tuning circuit configured to automatically tune the transmitter, wherein each plate of the receiver antenna has the shape of a rectangle having one inner short side, one outer short side, one inner long side and one outer long side, wherein the at least two elongate conductive plates of the receiver antenna are approximately parallel along either their outer long sides or their inner long sides, and wherein a length of each of the at least two elongate conductive plates and the resonant frequency are selected such that a majority of power transferred to the receiver antenna is from an electric field component of an electromagnetic field as in a capacitive coupling wireless power transfer scheme.

9. The transmitter of claim 8, wherein the at least two elongate conductive plates of the transmitter antenna are laterally spaced to define the volume.

10. The transmitter of claim 8, wherein the transmitter antenna comprises six conductive plates defining the volume.

11. The transmitter of claim 8, wherein each conductive plate of the transmitter antenna is formed of conductive tape.

12. The transmitter of claim 8, wherein the coil is constructed using strand wire.

13. The transmitter of claim 8, wherein the coil is a toroid spiral, cylindrical spiral, flat spiral or pancake coil.

14. The transmitter of claim 8, wherein the auto tuning circuit further comprises a current sensing circuit configured to provide a feedback signal.

15. The transmitter of claim 8, wherein the auto tuning circuit further comprises an oscillator configured to inject a start-up signal into the auto tuning circuit.

16. A vehicle comprising the transmitter of claim 8.

17. A table comprising the transmitter of claim 8.

18. The transmitter of claim 8, wherein the auto tuning circuit further comprises a delay line configured to delay the signal within the auto tuning circuit.

19. The transmitter of claim 18, wherein the delay line is an active inverter delay chain comprising complementary metal-oxide-semiconductor (CMOS) inverters connected in series.

20. The transmitter of claim 8, wherein the auto tuning circuit further comprises a decoupling circuit configured to decouple an output signal of the transmitter.

21. The transmitter of claim 20, wherein the decoupling circuit comprises a balun.

22. The transmitter of claim 8, wherein the auto tuning circuit is configured to sense an output voltage and current of the transmitter antenna and feedback a signal to the resonator for resonating the coil and the at least two elongate conductive plates of the transmitter antenna.

23. The transmitter of claim 22, wherein the auto tuning circuit comprises a phase detector configured to detect a phase of the output voltage and current and feedback the phase to the resonator for resonating the coil and the at least two elongate conductive plates of the transmitter antenna.

24. A container comprising the transmitter of claim 8.

25. The container of claim 24, wherein the container is shielded to prevent electromagnetic field (EMF) leakage.

26. The container of claim 25, wherein electric field strength is increased when the container is closed.

27. The transmitter of claim 8, wherein the auto tuning circuit further comprises circuitry configured to boost a signal to the transmitter antenna.

28. The transmitter of claim 27, wherein the circuitry comprises at least one of a voltage gain, a current gain and a power amplifier.

29. The transmitter of claim 28, wherein the power amplifier is a push-pull power amplifier.

30. The transmitter of claim 8, wherein the resonator further comprises modification circuitry configured to modify the output signal of the transmitter when a condition occurs.

31. The transmitter of claim 30, wherein the modification circuitry adjusts the power level of the output signal when the condition occurs.

32. The transmitter of claim 30, wherein the modification circuitry shuts off output of the transmitter when the condition occurs.

33. A receiver for receiving wirelessly transmitted power for powering a load, the receiver comprising:
a receiver antenna including at least two elongate conductive plates, wherein each plate of the receiver antenna has the shape of a rectangle having one inner short side, one outer short side, one inner long side and one outer long side, and wherein the at least two elongate conductive plates of the receiver antenna are approximately parallel along either their outer long sides or their inner long sides;
a single high quality factor (Q-factor) coil configured to be connected to the receiver antenna, the coil being separate from the receiver antenna; and
a power harvester configured to be connected to the coil for resonating the coil and the at least two elongate conductive plates at a resonant frequency to extract power from a resonant reactive near electric field in a volume generated by a transmitter antenna including at least two elongate conductive plates, wherein each plate of the transmitter antenna has the shape of a rectangle having one inner short side, one outer short side, one inner long side and one outer long side, and wherein the at least two elongate conductive plates of the transmitter antenna are approximately parallel along either their outer long sides or their inner long sides, and wherein a length of each of the at least two elongate conductive plates of the transmitter antenna and the resonant frequency are selected such that a majority of power extracted by the power harvester is from an electric field component of an electromagnetic field as in a capacitive coupling wireless power transfer scheme.

34. The receiver of claim 33, wherein the conductive plates of the receiver antenna are external to a housing accommodating the coil and the power harvester.

35. The receiver of claim 33, wherein the conductive plates of the receiver antenna are rectangular.

36. The receiver of claim 33, wherein the conductive plates of the receiver antenna are metallic.

37. The receiver of claim 33, wherein the coil is constructed of strand wire or inductors.

38. The receiver of claim 33, wherein the coil is a toroid, cylindrical spiral, flat spiral or pancake coil.

39. A radio communication device for receiving wirelessly transmitted power, the device comprising the receiver of claim 33.

40. A computing device for receiving wirelessly transmitted power, the device comprising the receiver of claim 28.

41. The receiver of claim 33, wherein the power harvester further comprises an auto tuning circuit configured to automatically tune the power harvester.

42. The receiver of claim 33, further comprising an impedance matching circuit.

43. The receiver of claim 42, wherein the impedance matching circuit comprises a balun.

44. A backpack for receiving wirelessly transmitted power, the backpack comprising the receiver of claim 33.

45. The backpack of claim 44, further comprising a battery charger connected to the receiver.

46. The backpack of claim 45, further comprising at least one rechargeable battery connected to the receiver configured to charge when no batteries are present in the battery charger.

47. The receiver of claim 33, wherein the power harvester further comprises modification circuitry configured to modify a signal received by the receiver when a condition occurs.

48. The receiver of claim 47, wherein the modification circuitry adjusts the signal received by the receiver when the condition occurs.

49. The receiver of claim 47, wherein the modification circuitry is a voltage converter and/or a rectifier.

50. The receiver of claim 49, wherein the modification circuitry is a rectifier and the receiver further comprises a load electrically connected to the rectifier.

* * * * *